United States Patent
Kelly et al.

(10) Patent No.: US 9,721,660 B2
(45) Date of Patent: Aug. 1, 2017

(54) CONFIGURABLE VOLATILE MEMORY WITHOUT A DEDICATED POWER SOURCE FOR DETECTING A DATA SAVE TRIGGER CONDITION

(71) Applicant: Microsoft Technology Licensing, LLC, Redmond, WA (US)

(72) Inventors: Bryan Kelly, Redmond, WA (US); Sriram Govindan, Redmond, WA (US); John J. Siegler, Carnation, WA (US); Badriddine Khessib, Redmond, WA (US); Mark A. Shaw, Sammamish, WA (US); J. Michael Andrewartha, Woodinville, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 303 days.

(21) Appl. No.: 14/557,708

(22) Filed: Dec. 2, 2014

(65) Prior Publication Data
US 2016/0118121 A1     Apr. 28, 2016

Related U.S. Application Data

(60) Provisional application No. 62/068,025, filed on Oct. 24, 2014.

(51) Int. Cl.
*G06F 13/00*      (2006.01)
*G11C 14/00*      (2006.01)
(Continued)

(52) U.S. Cl.
CPC ............ *G11C 14/0018* (2013.01); *G06F 1/30* (2013.01); *G06F 11/1441* (2013.01);
(Continued)

(58) Field of Classification Search
CPC .... G06F 11/1441; G06F 1/28; G06F 13/4068; G11C 14/0018
(Continued)

(56) References Cited

U.S. PATENT DOCUMENTS 7,269,764 B2   9/2007  Dart et al.
7,830,732 B2   11/2010  Moshayedi et al.
(Continued)

OTHER PUBLICATIONS

"SMART Technical Brief: NVDIMM", Retrieved on: Nov. 4, 2014, retrieved from: http://www.smartm.com/files/salesLiterature/dram/NVDIMM_technical_brief.pdf.
(Continued)

*Primary Examiner* — Tammara Peyton
(74) *Attorney, Agent, or Firm* — Liang IP, PLLC

(57) ABSTRACT

A volatile memory data save subsystem may include a coupling to a shared power source such as a chassis or rack battery, or generator. A data save trigger controller sends a data save command toward coupled volatile memory device(s) such as NVDIMMs and PCIe devices under specified conditions: a programmable amount of time passes without AC power, a voltage level drops below normal but is still sufficient to power the volatile memory device during a data save operation, the trigger controller is notified of an operating system shutdown command, or the trigger controller is notified of an explicit data save command without a system shutdown command. NVDIMMs can avoid reliance on dedicated supercapacitors and dedicated batteries. An NVDIMM may perform an asynchronous DRAM reset in response to the data save command. Voltage step downs may be coordinated among power supplies. After data is saved, power cycles and the system reboots.

20 Claims, 9 Drawing Sheets

(51) Int. Cl.

| | |
|---|---|
| *G06F 13/40* | (2006.01) |
| *G06F 13/42* | (2006.01) |
| *G11C 5/14* | (2006.01) |
| *G06F 1/30* | (2006.01) |
| *G06F 11/14* | (2006.01) |
| G06F 1/28 | (2006.01) |
| G11C 16/04 | (2006.01) |
| G06F 11/20 | (2006.01) |

(52) U.S. Cl.
CPC ...... *G06F 11/1456* (2013.01); *G06F 13/4068* (2013.01); *G06F 13/4282* (2013.01); *G11C 5/148* (2013.01); *G11C 14/009* (2013.01); *G06F 1/28* (2013.01); *G06F 11/2015* (2013.01); *G11C 16/0466* (2013.01); *Y02B 60/1228* (2013.01); *Y02B 60/1235* (2013.01)

(58) Field of Classification Search
USPC ...................................................... 714/14, 22
See application file for complete search history.

(56) References Cited

U.S. PATENT DOCUMENTS

| | | | | |
|---|---|---|---|---|
| 8,074,034 | B2* | 12/2011 | Sartore | G06F 12/0638 711/119 |
| 8,578,110 | B2* | 11/2013 | Fukazawa | G06F 11/1441 711/154 |
| 8,667,331 | B2* | 3/2014 | Hori | G06F 1/30 714/22 |
| 8,707,096 | B2* | 4/2014 | Sekino | G06F 11/1441 714/14 |
| 8,753,138 | B2 | 6/2014 | Foster et al. | |
| 9,588,565 | B1* | 3/2017 | Harland | G06F 1/28 |
| 2008/0235471 | A1 | 9/2008 | Feldman et al. | |
| 2009/0249008 | A1 | 10/2009 | Hosaka | |
| 2010/0052625 | A1 | 3/2010 | Cagno et al. | |
| 2012/0131253 | A1 | 5/2012 | McKnight et al. | |
| 2013/0086309 | A1 | 4/2013 | Lee et al. | |
| 2014/0215277 | A1 | 7/2014 | Judd | |

OTHER PUBLICATIONS

Huang, et al., "Design and implementation of Flash based NVDIMM", In Proceedings of IEEE Non-Volatile Memory Systems and Applications Symposium, Aug. 20, 2014, 6 pages.

"Backup Power Charge Control and Health Monitoring—A Technology Overview", Published on: Jun. 2014, retrieved from: http://snia.org/sites/default/files/Backup%20Power%20Charge%20Control%20%20Health%20Monitoring%20contributed%20by%20Paper%20Battery%20June%202014.pdf.

Evans, Chris, "Flash hits the motherboard with memory channel storage", Published on: Mar. 29, 2014, retrieved from: http://www.computerweekly.com/feature/Flash-hits-the-motherboard-with-memory-channel-storage.

"Using NVDIMM as Storage, In-Memory Database Gains Durability & Keeps High Performance", Published on: Oct. 8, 2013, retrieved from: http://www.broadwayworld.com/bwwgeeks/article/Using-NVDIMM-as-Storage-In-Memory-Database-Gains-Durability-Keeps-High-Performance-20131008.

"NVDIMM", retrieved from <<http://en.wikipedia.org/wiki/NVDIMM>>, 2 pages, May 8, 2014.

"Supercapacitor", retrieved from <<http://en.wikipedia.org/wiki/Supercapacitor>>, 34 pages, Oct. 7, 2014.

"NVDIMM FAQ", retrieved from <<http://www.vikingtechnology.com/nvdimm-faq>>, 5 pages, copyright 2014.

Li Zhao, et al., Fuel Cells for Data Centers: Power Generation Inches From the Server>>, Microsoft Research Technical Report MSR-TR-2014-37, retrieved at <<http://research.microsoft.com/pubs/210641/FCDC-TechReport.pdf>>, 2014.

"PCI Express", retrieved from <<http://en.wikipedia.org/wiki/PCI_Express>>, 15 pages, Oct. 13, 2014.

"Platform Controller Hub", retrieved from <<http://en.wikipedia.org/wiki/Platform_Controller_Hub>>, 5 pages, Aug. 11, 2014.

"Haswell (microarchitecture)", retrieved from <<http://en.wikipedia.org/wiki/Haswell_(microarchitecture)>>, 20 pages, Oct. 14, 2014.

"Complex programmable logic device", retrieved from <<http://en.wikipedia.org/wiki/Complex_programmable_logic_device>>, 4 pages, Aug. 14, 2014.

"Intelligent Platform Management Interface", retrieved from <<http://en.wikipedia.org/wiki/Intelligent_Platform_Management_Interface>>, 6 pages, Sep. 24, 2014.

"Hot Swap Controllers", retrieved from <<http://www.linear.com/products/hot_swap_controllers>>, 3 pages, 2014.

"General-purpose input/output", retrieved from <<http://en.wikipedia.org/wiki/General-purpose_input/output>>, 3 pages, Oct. 3, 2014.

"International Search Report and Written Opinion Issued in PCT Application No. PCT/US2015/056294", Mailed Date: Dec. 18, 2015, 10 Pages.

"International Preliminary Report on Patentability Issued in PCT Application No. PCT/US2015/056294", Mailed Date: Sep. 16, 2016, 6 Pages.

* cited by examiner

CONFIGURABLE VOLATILE MEMORY WITHOUT A DEDICATED POWER SOURCE FOR DETECTING A DATA SAVE TRIGGER CONDITION

RELATED APPLICATION

The present application claims priority to, and incorporates herein by reference the entirety of, U.S. provisional patent application No. 62/068,025 filed 24 Oct. 2014.

COPYRIGHT AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Rack mounted computer servers use self-contained hardware, in the sense that one can plug a rack mounted server into a standard electrical outlet, connect network cables, boot, and have an operational server. Rack mounted servers are often mounted in a computer hardware rack, which is usually 19 inches in width, but some rack mounted servers may also sit in other racks, or sit on a table or another surface instead of being mounted in a rack. Blade mounted servers are not self-contained in the way that rack mounted servers are self-contained. Blade mounted servers are designed to be mounted in a blade enclosure, called a "chassis", which includes one or more power supplies and networking components. The chassis with one or more blades inserted may be rack mountable.

After power stops flowing to a rack, a chassis, a rack mounted server, a blade mounted server, and/or an individual component of such a server that has data stored in volatile memory, the data may be lost and be unrecoverable. One approach to reduce or prevent loss of data is to replicate the data across multiple servers in a data center, or even across geographically separated data centers. However, a wide variety of other approaches are also possible for saving data despite power loss. Different approaches have different technical characteristics, and any two given approaches are not necessarily related to one another apart from sharing the concept of preserving data against power loss.

SUMMARY

Some embodiments or examples include a coupling to a shared power source such as a chassis or rack battery, or generator. In some embodiments or examples, a data save trigger controller sends a data save command toward coupled volatile memory device(s) such as NVDIMMs and PCIe devices under one or more of the following conditions: a programmable amount of time passes without AC power, a voltage level drops below normal but is still sufficient to power the volatile memory device during a data save operation, the trigger controller is notified of an operating system shutdown command, and/or the trigger controller is notified of an explicit data save command without a shutdown command.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope of any example.

DETAILED DESCRIPTION

Acronyms

Figure 1:
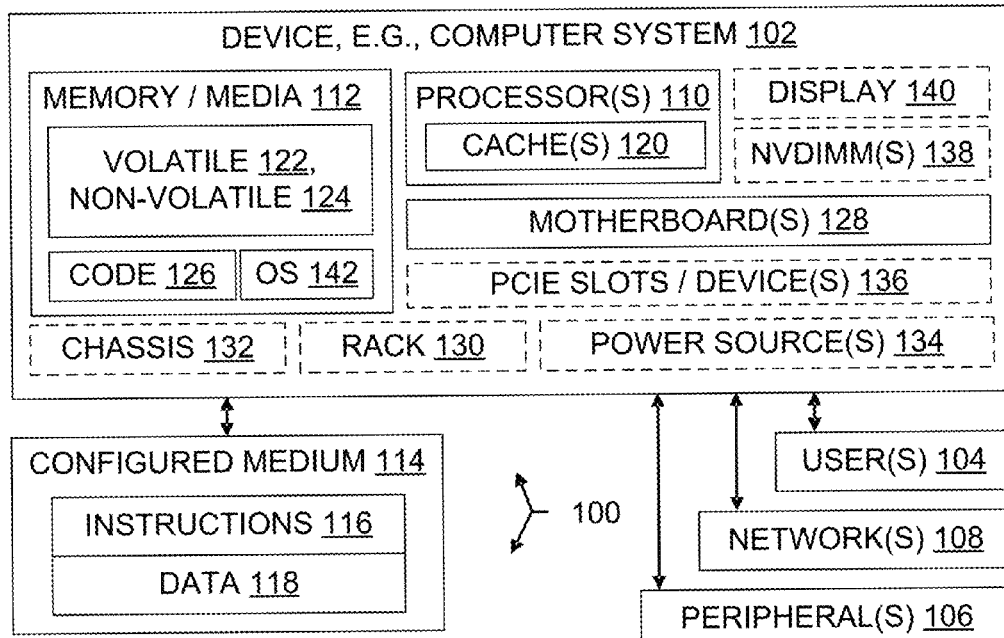
FIG. 1 is a block diagram illustrating a computer system having at least one processor and at least one memory which interact with one another under the control of hardware and/or software, as well as illustrating other items in an operating environment which may extend over multiple network nodes, and also illustrating aspects of some configured storage media.

Some acronyms and other terms are defined below, but others may be defined elsewhere herein or require no definition to be understood by one of skill.

AC: alternating current
ACPI DSDT/SSDT: Advanced Configuration and Power Interface Differentiated System Description Table/Secondary System Description Table
ADR: asynchronous DRAM refresh
ALU: arithmetic and logic unit
AND: a type of logic gate (not an acronym)
API: application program interface
ASCII: American Standard Code for Information Interchange
ASL: ACPI Source Language
Aux: auxiliary
BIOS: basic input/output system
BMC: baseboard management controller
CD: compact disc
CKTS: circuits
CM: chassis manager CPLD: complex programmable logic device
CPU: central processing unit
CRB: Customer Reference Board
CRC: cyclic redundancy check
DC: direct current
DCU: digital control unit (an example of a controller)
DDR3: double data rate type 3
DG: diesel generator
DIMM: dual in-line memory module
DSM: device-specific method
DRAM: dynamic random access memory
DVD: digital versatile disk or digital video disc
FBDIMM: fully buffered DIMM
FPGA: field-programmable gate array
FPU: floating point processing unit
FW: firmware
GB: gigabyte
GbE or GBE: gigabit ethernet
GPIO: general purpose input/output
GPU: graphical processing unit
GUI: graphical user interface
HDD: hard disk drive
HSC: hot swap controller
I2C: inter-integrated circuit
IDE: integrated development environment, sometimes also called "interactive development environment"
IIO: integrated input/output
IoT: Internet of Things
IPMI: Intelligent Platform Management Interface
ISO/IEC International Organization for Standardization/International Electrotechnical Commission
LES: local energy storage
M.2: a specification for internally mounted computer expansion cards and connectors
MEZZ: mezzanine
MSB: most significant bit
NAND: negated AND/not AND
NIC: network interface card
NV: non-volatile
NVMe: non-volatile memory express
OS: operating system
PCH: platform controller hub
PCIe: Peripheral Component Interconnect Express; sometimes written PCIE herein
PMBUS: Power Management Bus
PSU: power supply unit
QD: queue depth
RAID: Redundant Array of Independent Disks
RAM: random access memory
RDIMM: registered dual in-line memory module
ROM: read only memory
SAS: Serial Attached SCSI
SATA: serial ATA/serial AT attachment/serial advanced technology attachment
SSATA: secondary SATA
SCSI: small computer system interface
SMBUS: System Management Bus
SPD: Serial Presence Detect
SRAM: static RAM
SSD: solid state drive
supercap: supercapacitor
UART: universal asynchronous receiver/transmitter
UEFI: Unified Extensible Firmware Interface
UPS: uninterruptible power supply
V: volts Overview The technical character of examples described herein will be apparent to one of ordinary skill in the art, and will also be apparent in several ways to a wide range of attentive readers. First, some embodiments address technical problems such as data preservation in the face of imminent or actual power loss, cost-effective power monitoring, supercap cooling requirements, and/or motherboard real estate requirements for dedicated batteries for volatile memory devices. Second, some embodiments include technical components such as computing hardware which operates in a manner beyond the typical operation of a general purpose computer, e.g., by continuing to power a PCIe rail and/or NVDIMM slot despite a loss of AC power and the lack of any batteries or supercaps which are dedicated to the particular PCIe rail or NVDIMM slot. Third, technical effects provided by some embodiments include preservation of data that would otherwise be lost from volatile memory when AC power is lost. Various technical adaptations are also described herein, particularly in several example architecture textual discussions and/or drawings.

Some examples described herein may be viewed in a broader context. For instance, concepts such as data, delays, power, saving and/or triggering may be relevant to a particular embodiment. However, it does not follow from the availability of a broad context that exclusive rights are being sought herein for abstract ideas; they are not. Rather, the present disclosure is focused on providing appropriately specific embodiments whose technical effects fully or partially solve particular technical problems and improve the function of computer systems. Other media, systems, and methods involving data, delays, power, saving and/or triggering are outside the present scope. Accordingly, vagueness, mere abstractness, lack of technical character, and accompanying proof problems are also avoided under a proper understanding of the present disclosure.

Some Terminology

Reference will now be made to exemplary embodiments such as those illustrated in the drawings, and specific language will be used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise their right to their own lexicography, including the right to copy language into claims and into descendant applications from any location herein. Quoted terms are defined explicitly, but quotation marks are not used when a term is defined implicitly. Terms may be defined, either explicitly or implicitly, here in the Detailed Description and/or elsewhere in the application file.

As used herein, a "computer system" may include, for example, one or more servers, motherboards, processing nodes, personal computers (portable or not), personal digital assistants, smartphones, cell or mobile phones, other mobile devices having at least a processor and a memory, and/or other device(s) providing one or more processors controlled at least in part by instructions. The instructions may be in the form of firmware or other software in memory and/or specialized circuitry. In particular, although it may occur that many embodiments run on workstation or laptop computers, other embodiments may run on other computing devices, and any one or more such devices may be part of a given embodiment. Cloud servers are discussed as particular examples of computer systems, but cloud servers and cloud server subsystems are not the only examples of computer systems or devices which can incorporate teachings presented herein.

A "multithreaded" computer system is a computer system which supports multiple execution threads. The term "thread" should be understood to include any code capable of or subject to scheduling (and possibly to synchronization), and may also be known by another name, such as "task," "process," or "coroutine," for example. The threads may run in parallel, in sequence, or in a combination of parallel execution (e.g., multiprocessing) and sequential execution (e.g., time-sliced). Multithreaded environments have been designed in various configurations. Execution threads may run in parallel, or threads may be organized for parallel execution but actually take turns executing in sequence. Multithreading may be implemented, for example, by running different threads on different cores in a multiprocessing environment, by time-slicing different threads on a single processor core, or by some combination of time-sliced and multi-processor threading. Thread context switches may be initiated, for example, by a kernel's thread scheduler, by user-space signals, or by a combination of user-space and kernel operations. Threads may take turns operating on shared data, or each thread may operate on its own data, for example.

A "logical processor" or "processor" is a single independent hardware thread-processing unit, such as a core in a simultaneous multithreading implementation. As another example, a hyperthreaded quad core chip running two threads per core has eight logical processors. A logical processor includes hardware. The term "logical" is used to prevent a mistaken conclusion that a given chip has at most one processor; "logical processor" and "processor" are used interchangeably herein. Processors may be general purpose, or they may be tailored for specific uses such as graphics processing, signal processing, floating-point arithmetic processing, encryption, I/O processing, and so on.

A "multiprocessor" computer system is a computer system which has multiple logical processors. Multiprocessor environments occur in various configurations. In a given configuration, all of the processors may be functionally equal, whereas in another configuration some processors may differ from other processors by virtue of having different hardware capabilities, different software assignments, or both. Depending on the configuration, processors may be tightly coupled to each other on a single bus, or they may be loosely coupled. In some configurations the processors share a central memory, in some they each have their own local memory, and in some configurations both shared and local memories are present.

"Kernels" include operating systems, hypervisors, virtual machines, BIOS code, and similar hardware interface software.

"Code" means processor instructions, data (which includes constants, variables, and data structures), or both instructions and data.

"Program" is used broadly herein, to include applications, kernels, drivers, interrupt handlers, firmware, state machines, libraries, and other code written by programmers (who are also referred to as developers).

"Routine" means a function, a procedure, an exception handler, an interrupt handler, or another block of instructions which receives control via a jump and a context save. A context save pushes a return address on a stack or otherwise saves the return address, and may also save register contents to be restored upon return from the routine.

"IoT" or "Internet of Things" means any networked collection of addressable embedded computing nodes. Such nodes are examples of computer systems as defined herein, but they also have at least two of the following characteristics: (a) no local human-readable display; (b) no local keyboard; (c) the primary source of input is sensors that track sources of non-linguistic data; (d) no local rotational disk storage—RAM chips or ROM chips provide the only local memory; (e) no CD or DVD drive; (f) embedment in a household appliance; (g) embedment in an implanted medical device; (h) embedment in a vehicle; (i) embedment in a process automation control system; or (j) a design focused on one of the following: environmental monitoring, civic infrastructure monitoring, industrial equipment monitoring, energy usage monitoring, human or animal health monitoring, or physical transportation system monitoring.

As used herein, "include" allows additional elements (i.e., includes means comprises) unless otherwise stated. "Consists of" means consists essentially of, or consists entirely of. X consists essentially of Y when the non-Y part of X, if any, can be freely altered, removed, and/or added without altering the functionality of claimed embodiments so far as a claim in question is concerned.

"Process" may be used herein as a term of the computing science arts, and in that technical sense encompasses resource users, namely, coroutines, threads, tasks, interrupt handlers, application processes, kernel processes, procedures, and object methods, for example. "Process" may also be used herein as a patent law term of art, e.g., in describing a process claim as opposed to a system claim or an article of manufacture (configured storage medium) claim. Similarly, "method" may be used herein at times as a technical term in the computing science arts (a kind of "routine") and also at times as a patent law term of art (a "process"). Those of skill will understand which meaning is intended in a particular instance, and will also understand that a given claimed process or method (in the patent law sense) may sometimes be implemented using one or more processes or methods (in the computing science sense).

"Automatically" means by use of automation (e.g., general purpose computing hardware configured by software for specific operations and technical effects discussed herein), as opposed to without automation. In particular, steps performed "automatically" are not performed by hand on paper or in a person's mind, although they may be initiated by a human person or guided interactively by a human person. Automatic steps are performed with a machine in order to obtain one or more technical effects that would not be realized without the technical interactions thus provided.

One of skill understands that technical effects are the presumptive purpose of a technical embodiment. The mere fact that calculation is involved in an embodiment, for example, and that some calculations can also be performed without technical components (e.g., by paper and pencil, or even as mental steps) does not remove the presence of the technical effects or alter the concrete and technical nature of the embodiment. Persons of skill will acknowledge that in some cases calculations simply cannot be performed rapidly enough and reliably enough by mental steps or by paper and pencil to provide the technical effects of an embodiment.

"Computationally" likewise means a computing device (processor plus memory, at least) is being used, and excludes obtaining a result by mere human thought or mere human action alone. For example, doing arithmetic with a paper and pencil is not doing arithmetic computationally as understood herein. Computational results are faster, broader, deeper, more accurate, more consistent, more comprehensive, and/or otherwise provide technical effects that are beyond the scope of human performance alone. "Computational steps" are steps performed computationally. Neither "automatically" nor "computationally" necessarily means "immediately". "Computationally" and "automatically" are used interchangeably herein.

"Proactively" means without a direct request from a user. Indeed, a user may not even realize that a proactive step by an embodiment was possible until a result of the step has been presented to the user. Except as otherwise stated, any computational and/or automatic step described herein may also be done proactively.

"Linguistically" means by using a natural language or another form of communication which is often employed in face-to-face human-to-human communication. Communicating linguistically includes, for example, speaking, typing, or gesturing with one's fingers, hands, face, and/or body.

Throughout this document, use of the optional plural "(s)", "(es)", or "(ies)" means that one or more of the indicated feature is present. For example, "processor(s)" means "one or more processors" or equivalently "at least one processor".

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party or item of interest such as connecting, controlling, coordinating, coupling, detecting, executing, dropping, lowering, monitoring, notifying, operating, powering, programming, providing, receiving, saving, sending, sharing, shutting down, triggering (and connects, connected, controls, controlled, etc.) with regard to a destination or other subject may involve intervening action such as disabling, enabling, forwarding, copying, uploading, downloading, encoding, decoding, compressing, decompressing, encrypting, decrypting, authenticating, invoking, and so on by some other party, yet still be understood as being performed directly by the party of interest.

Whenever reference is made to data or instructions, it is understood that these items configure a computer-readable memory and/or computer-readable storage medium, thereby transforming it to a particular article, as opposed to simply existing on paper, in a person's mind, or as a mere propagated signal, for example. Unless expressly stated otherwise in a claim, a claim does not cover a signal per se. For the purposes of patent protection in the United States, a memory, a computer-readable storage medium, and any other computer-readable medium is not a propagating signal or a carrier wave, and it is not outside the scope of patentable subject matter under United States Patent and Trademark Office (USPTO) interpretation of the In re Nuijten case.

Moreover, notwithstanding anything apparently to the contrary elsewhere herein, a clear distinction is to be understood between (a) computer readable storage media, computer readable media, and computer readable memory, on the one hand, and (b) transmission media, also referred to as signal media or propagated signals, on the other hand. A transmission medium is a propagating signal or a carrier wave medium. By contrast, computer readable media, computer readable storage media, and computer readable memory are not propagating signal or carrier wave media. Unless expressly stated otherwise, "computer readable medium" means a computer readable storage medium, not a propagating signal per se.

An "embodiment" herein is an example. The term "embodiment" is not interchangeable with "the invention"; neither is the term "example". Embodiments may freely share or borrow aspects to create other embodiments (provided the result is operable), even if a resulting aspect combination is not explicitly described per se herein. Requiring each and every permitted combination to be explicitly described is unnecessary for one of skill in the art, and would be contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination would be contrary to policies calling for patent specifications to be concise and for readers to be knowledgeable in the technical fields concerned.

Operating Environments

With reference to FIG. 1, an operating environment 100 for an embodiment may include a computer system 102. The computer system 102 may be a multiprocessor computer system, or not. An operating environment may include one or more machines in a given computer system, which may be clustered, client-server networked, and/or peer-to-peer networked. An individual machine is a computer system, and a group of cooperating machines is also a computer system. A given computer system 102 may be configured for end-users, e.g., with applications, for administrators, as a server, as a distributed processing node, as an IoT node, and/or in other ways.

Human users 104 may interact with the computer system 102 by using displays, keyboards, and other peripherals 106, via typed text, touch, voice, movement, computer vision, gestures, and/or other forms of I/O. A user interface may support interaction between an embodiment and one or more human users. A user interface may include a command line interface, a graphical user interface (GUI), natural user interface (NUI), voice command interface, and/or other interface presentations. A user interface may be generated on a local desktop computer, or on a smart phone, for example, or it may be generated from a web server and sent to a client. The user interface may be generated as part of a service and it may be integrated with other services, such as social networking services. A given operating environment includes devices and infrastructure which support these different user interface generation options and uses.

Natural user interface (NUI) operation may use speech recognition, touch and stylus recognition, gesture recognition both on screen and adjacent to the screen, air gestures, head and eye tracking, voice and speech, vision, touch, gestures, and/or machine intelligence, for example. Some examples of NUI technologies include touch sensitive displays, voice and speech recognition, intention and goal understanding, motion gesture detection using depth cameras (such as stereoscopic camera systems, infrared camera systems, RGB camera systems and combinations of these), motion gesture detection using accelerometers/gyroscopes, facial recognition, 3D displays, head, eye, and gaze tracking, immersive augmented reality and virtual reality systems, all of which provide a more natural interface, as well as technologies for sensing brain activity using electric field sensing electrodes (electroencephalograph and related tools).

As another example, a game may be resident on a Microsoft XBOX Live® server (mark of Microsoft Corporation) or other game server. The game may be purchased from a console and it may be executed in whole or in part on the server, on the console, or both. Multiple users may interact with the game using standard controllers, air gestures, voice, or using a companion device such as a smartphone or a tablet. A given operating environment includes devices and infrastructure which support these different use scenarios.

System administrators, developers, engineers, and end-users are each a particular type of user 104. Automated agents, scripts, playback software, and the like acting on behalf of one or more people may also be users 104. Storage devices and/or networking devices may be considered peripheral equipment in some embodiments. Other computer systems not shown in FIG. 1 may interact in technological ways with the computer system 102 or with another system embodiment using one or more couplings and/or connections to a network 108 via network interface equipment, for example.

The computer system 102 includes at least one logical processor 110 having one or more processor caches 120. The computer system 102, like other suitable systems, also includes one or more computer-readable storage media 112. Media 112 may be of different physical types. The media 112 may be volatile memory 122, non-volatile memory 124, fixed in place media, removable media, magnetic media, optical media, solid-state media, and/or of other types of physical durable storage media (as opposed to merely a propagated signal). In particular, a configured medium 114 such as a portable (i.e., external) hard drive, CD, DVD, memory stick, or other removable non-volatile memory medium may become functionally a technological part of the computer system when inserted or otherwise installed, making its content accessible for interaction with and use by processor 110. The removable configured medium 114 is an example of a computer-readable storage medium 112. Some other examples of computer-readable storage media 112 include built-in RAM, ROM, hard disks, and other memory storage devices which are not readily removable by users 104. For compliance with current United States patent requirements, neither a computer-readable medium nor a computer-readable storage medium nor a computer-readable memory is a signal per se.

The medium 114 and/or other media 112 is configured with instructions 116 that are executable by a processor 110; "executable" is used in a broad sense herein to include machine code, interpretable code, bytecode, firmware, and/or code that runs on a virtual machine, for example. The medium 114 is also configured with data 118 which is created, modified, referenced, and/or otherwise used for technical effect by execution of the instructions 116. The instructions 116 and the data 118 configure the memory or other storage medium 114 in which they reside; when that memory or other computer readable storage medium is a functional part of a given computer system, the instructions 116 and data 118 also configure that computer system. In some embodiments, a portion of the data 118 is representative of real-world items such as product characteristics, inventories, physical measurements, settings, images, readings, targets, volumes, and so forth. Such data is also transformed by backup, restore, commits, aborts, reformatting, and/or other technical operations.

Although an embodiment may be described as being implemented as software instructions executed by one or more processors in a computing device (e.g., general purpose computer, cell phone, or gaming console), such description is not meant to exhaust all possible embodiments. One of skill will understand that the same or similar functionality can also often be implemented, in whole or in part, directly in hardware logic, to provide the same or similar technical effects. Alternatively, or in addition to software implementation, the technical functionality described herein can be performed, at least in part, by one or more hardware logic components. For example, and without excluding other implementations, an embodiment may include hardware logic components such as Field-Programmable Gate Arrays (FPGAs), Application-Specific Integrated Circuits (ASICs), Application-Specific Standard Products (ASSPs), System-on-a-Chip components (SOCs), Complex Programmable Logic Devices (CPLDs), and similar components. Components of an embodiment may be grouped into interacting functional modules based on their inputs, outputs, and/or their technical effects, for example.

In the illustrated environments 100, code 126 such as source code and/or executable code may be reside in media 112 and/or in other hardware, e.g., as firmware. Code may include calls to routines, and may include data structures such as objects, lists, trees, other linked structures, and/or other constructs (sometimes referred to as "artifacts"). Operating systems 142 and other kernels include code 126. Applications also include code 126. The term "application" is used broadly herein. Some examples of applications include business software, industrial software, medical applications, collaboration software, software which provides access to a database, software which displays editable information, games, app store purchases, software-as-a-service code, middleware, kernels, server code and other back-end applications, and web browsers and scripts or other code run by them as plug-ins. Source code is written in one or more programming languages. Executable code created from source in a given programming language is sometimes also referred to as being in that language, but executable code is understood to include machine code. As used herein, "machine code" means low-level code, or computer code that is tailored to a particular hardware architecture or tailored to a particular virtual machine architecture. Some familiar examples of machine code include compiled code, microcode, firmware code, binary code, native code, object code, assembly language code, p-code, bytecode, dynamic link library code, and common intermediate language code.

The code 126, data 118, and other items shown in the Figures and/or discussed in the text, may each reside partially or entirely within one or more hardware media, thereby configuring those media for technical effects which go beyond the "normal" (i.e., least common denominator) interactions inherent in all hardware—software cooperative operation.

In addition to processors 110 (CPUs, ALUs, FPUs, and/or GPUs), and memory/storage media 112, an operating environment may also include other hardware, such as hardware in motherboard(s) 128, rack(s) 130, one or more chassis 132, buses, power supplies and/or batteries and/or other power sources 134, PCIe devices 136, NVDIMMs 138, wired and wireless network interface cards, accelerators, and display(s) 140, for instance, whose respective operations are described herein to the extent not already apparent to one of skill. NVDIMMs contain both volatile memory and non-volatile memory. Data in an NVDIMM's volatile memory can be backed up to that NVDIMM's non-volatile memory. The presence of a non-volatile memory component is a characteristic that distinguishes NVDIMMs from DIMMs. With regard to storage device performance, a system 102 with NVDIMMs may have four distinct tiers of storage device performance, e.g., processor 110 cache, NVDIMM volatile storage, RAM disk or SSD, and hard disks or network attached storage. Adding NVDIMM to a system architecture may provide order of magnitude gains in lowered latency and increased throughput.

In some embodiments peripherals 106 such as human user I/O devices (screen, keyboard, mouse, tablet, microphone, speaker, motion sensor, etc.) will be present in operable communication with one or more processors 110 and memory. However, an embodiment may also be deeply embedded in a technical system, such as a portion of the Internet of Things, such that no human user 104 interacts directly and linguistically with the embodiment. Software processes may be users 104.

In some embodiments, the system includes multiple computers or other devices 102 connected physically and/or coupled wirelessly in a network. Networking interface equipment can provide access to networks 108, using components such as a packet-switched network interface card, a wireless transceiver, or a telephone network interface, for example, which may be present in a given computer system. However, an embodiment may also communicate technical data and/or technical instructions through direct memory access, removable non-volatile media, or other information storage-retrieval and/or transmission approaches, or an embodiment in a computer system may operate without communicating with other computer systems.

Some embodiments operate in a "cloud" computing environment and/or a "cloud" storage environment in which computing services are not owned but are provided on demand. Cloud servers are used as examples herein, but the teachings may also be applied to servers used in other capacities, e.g., LAN servers, database servers, data center servers which are separated from the internet physically and/or by firewall or security software, server clusters, and other servers which are not entirely (and in some cases not even partially) viewed by those of skill as cloud servers. Any server which has data in volatile memory and is potentially subject to degradation, corruption, or loss of such data due to intermittent or interrupted power, may benefit from an implementation of the present technology.

One or more items may be shown in outline form in the Figures to emphasize that they are not necessarily part of the illustrated operating environment or all embodiments, but may interoperate with items in the operating environment or some embodiments as discussed herein. It does not follow that items not in outline form are necessarily required, in any Figure or any embodiment. In particular, FIG. 1 is provided for convenience; inclusion of an item in FIG. 1 does not imply that the item, or the describe use of the item, was known prior to the current innovations.

A Motherboard Example

Figure 2:
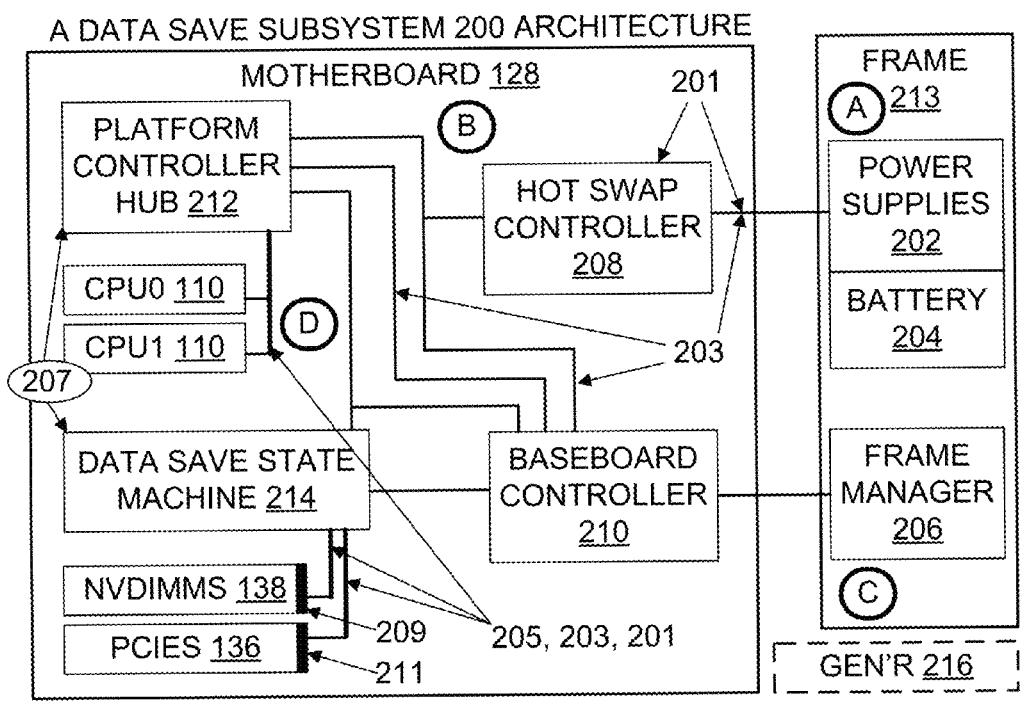
FIG. 2 is a diagram illustrating some components and some couplings in an architecture which supports data save triggers.

Some examples include components coupled in an architecture that is consistent with the diagram in FIG. 2. In this sense, "consistent with" a Figure means that additional couplings or connections or components may be present which are not shown in the Figure, that the couplings or connections shown may be unidirectional or bidirectional, that the couplings or connections shown may include logic gates which are not shown explicitly in the Figure, and that a particular implementation may have voltage levels, resistors, particular pin assignments, and/or particular chips which are not shown explicitly in the Figure. A given component shown in a Figure may be implemented using one or more chips and/or buses.

In one example implementation consistent with FIG. 2, motherboard 128 is a server blade motherboard, baseboard controller 210 includes a BMC, platform controller hub 212 includes a PCH, and data save state machine 214 includes a CPLD. Couplings (e.g., connections) are indicated by lines in FIG. 2, with the understanding that a given line may represent one or multiple connections. For example, the line between PCH 212 and data save state machine 210 represents electrical connections between several pins of each component in some implementations, as illustrated by other Figures. In general, lines of the FIG. 2 schematic represent one or more power, ground, command, data, and/or other connections. One of skill will also understand that additional connections not explicitly shown in the Figure(s) may also be present in a given implementation, and will readily provide such additions as implementation details.

In some embodiments, data save triggers are implemented for events associated with respective portions of the FIG. 2 architecture as follows:

A: battery emergency capacity
B: 12V voltage drop
C: explicit OS shutdown
D: soft/hard power off Some examples include a volatile memory data save subsystem 200 for a motherboard 128 in a system 102. The subsystem 200 includes a volatile memory device shared power source coupling 201 which when coupled to a shared power source 202 and/or 204 and also coupled to a volatile memory device 110, 136 and/or 138 by the motherboard 128 provides operating power to the volatile memory device. In this example, the volatile memory device shared power source coupling 201 includes at least a hot swap controller 208 and traces 203 that carry power from the shared power source(s) toward the volatile memory device(s). In this example, each volatile memory device is one of at least two separately pluggable devices that receive power from the shared power source. NVDIMMs and PCIe devices are pluggable devices. CPUs are also considered "pluggable" devices in this sense even if they are soldered to the motherboard, because they were plugged into the motherboard at an earlier time. Traces 203, by contrast, are not pluggable but are instead an integral part of the motherboard from the moment of their creation.

The illustrated subsystem 200 also includes a data save trigger coupling 205 which when coupled to the volatile memory device and triggered sends a data save command toward the volatile memory device. In this example, the data save trigger coupling 205 includes at least traces 203 that carry the data save command signal(s).

The illustrated subsystem 200 also includes a data save trigger controller 207 which operates to trigger the data save trigger coupling 205. In this example, the data save trigger controller 207 includes at least the data save state machine 214 and the platform controller hub 212. The data save trigger controller 207 triggers data save operation(s) when at least one of the conditions denoted (a) through (d) below occur. A given embodiment may detect and respond to only one of these conditions, or to any two of these conditions, or to any three of these conditions, or to all four conditions, depending on the particular embodiment. A given embodiment may also perform data save operation(s) that are triggered in response to one or more other conditions.

Condition (a) is that a programmable amount of time passes with the volatile memory device being powered by a source which is not driven by an AC power source. In the illustrated architecture, this involves any or all of devices 110, 136, 138 being driven by a chassis battery 204 or by a power supply 202 that is fed by a local emergency generator (not shown), for example. A rack 130 battery could be similarly used.

Condition (b) is that a voltage level on the volatile memory device shared power source drops to a value which is less than normal operating power but is still sufficient to power the volatile memory device during a data save operation. In the example architecture, this involves a drop in voltage to and through the hot swap controller 208.

Condition (c) is that the data save trigger controller is notified of an operating system shutdown command. In the example architecture, this involves a notification sent by the chassis manager 206; a shutdown notification could be similarly provided by a rack 130 manager.

Condition (d) is that the data save trigger controller is notified of an explicit data save command in the absence of an operating system shutdown command. In the example architecture, this involves an ADR signal from the platform controller hub 212 to the CPUs 110. In some examples, it may also involve a data save command from a rack manager and/or a chassis manager.

In some embodiments of the volatile memory data save subsystem 200, the volatile memory device includes an NVDIMM 138, the volatile memory device shared power source coupling 201 includes an NVDIMM slot 209, and the shared power source includes at least one of: a chassis battery 204, a shared rack level battery system 204, a diesel generator 216, a natural gas generator 216, another generator 216.

In some embodiments of the volatile memory data save subsystem 200, the volatile memory device includes an NVDIMM 138 which has no dedicated supercapacitor and also has no dedicated battery.

In some embodiments of the volatile memory data save subsystem 200, the volatile memory device includes a PCIe device 136, and the volatile memory device shared power source coupling includes a PCIe rail 211 on the motherboard.

In some embodiments of the volatile memory data save subsystem 200, the data save trigger controller 207 operates to trigger the data save trigger coupling when the programmable amount of time passes with the volatile memory device being powered by a chassis battery 204, and the programmable amount of time was previously programmed based on a chassis battery power estimation.

In some embodiments of the volatile memory data save subsystem 200, the data save trigger controller 207 operates to trigger the data save trigger coupling when the power level on the volatile memory device shared power source drops below a 12V normal operating power to a level between 10.8V and 11.5V which is sufficient to power the volatile memory device during the data save operation.

In some embodiments of the volatile memory data save subsystem 200, the data save trigger controller 207 operates to trigger the data save trigger coupling when the data save trigger controller is notified of an explicit data save command in the absence of an operating system shutdown command.

Some examples include a volatile memory data save subsystem 200 for a motherboard 128 in a server system 102. The subsystem 200 includes a frame 213 having a power supply 202 and a frame manager 206. The frame 213 includes at least one chassis 132 and/or includes at least one rack 130. A plurality of volatile memory device power source couplings 201 are coupled to the frame power supply 202 and to respective volatile memory device groups, each volatile memory device group including at least one volatile memory device 110, 136, and/or 138. A data save trigger coupling 205 sends a data save command toward at least one of the volatile memory devices, when coupled to at least one of the volatile memory devices and triggered. A data save trigger controller 207 operates to trigger the data save trigger coupling when at least one of the following conditions occur: (a) a programmable amount of time passes with the frame power supply not receiving AC power; (b) the frame power supply drops output voltage to a value which is less than a normal operating level but is still sufficient to power the volatile memory device during a data save operation; (c) the data save trigger controller is notified of an operating system shutdown command; or (d) the data save trigger controller is notified of an explicit data save command in the absence of an operating system shutdown command. In some examples, the server system 102 is further characterized in that each of the volatile memory devices has no dedicated supercapacitor and also has no dedicated battery. That is, the volatile memory devices in question are powered only from sources which each volatile memory device shares with at least one other volatile memory device. Additional volatile memory devices with dedicated power sources may also be present in the server, but they are not part of the volatile memory data save subsystem.

In some embodiments of the volatile memory data save subsystem 200, at least a portion of the data save trigger controller 207 resides in the frame manager 206. For example, code and/or hardware in the manager 206 that detects an OS shutdown command may be considered part of the data save trigger controller 207 in some embodiments. Also, code and/or hardware in the manager 206 that detects loss of AC power, predicts battery 204 power availability, and/or otherwise detects or implements one or more of the trigger conditions (a)-(d) may be considered part of the data save trigger controller 207 in some embodiments.

In some embodiments of the volatile memory data save subsystem, the volatile memory device power source couplings 205 include at least one of the following: an NVDIMM slot 209, a PCIe rail 211.

In some embodiments, the frame 213 includes a chassis 132, the power supply 204 is a chassis power supply, and at least one of the volatile memory devices resides on a blade server 102 which is coupled to the chassis 132. In some embodiments, the frame 213 includes a rack 130, the power supply 204 is a rack power supply, and at least one of the volatile memory devices resides on a rack mounted server 102 which is coupled to the rack 130.

In some embodiments of the volatile memory data save subsystem 200, the frame data save trigger coupling 205 is coupled to all of the volatile memory devices on the motherboard 128 and when triggered, the coupling 205 sends a data save command toward all of the volatile memory devices.

Processes

Figure 3:
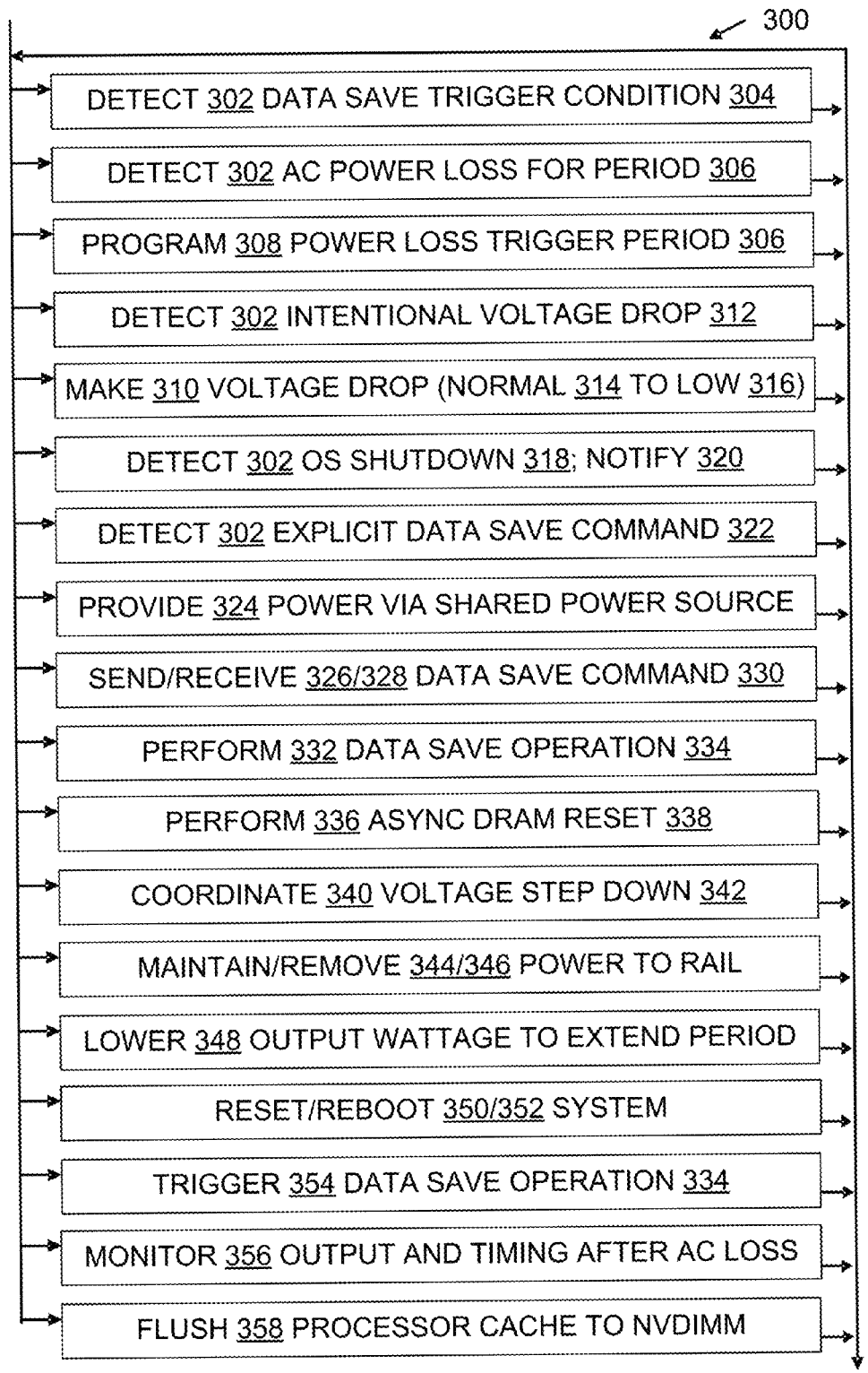
FIG. 3 is a flow chart illustrating steps of some processes and some configured storage media for configurable data save operations.

FIG. 3 illustrates some process embodiments in a flowchart 300. Technical processes shown in the Figures or otherwise disclosed may be performed in some embodiments automatically, e.g., by code and/or hardware requiring little or no contemporaneous live user input. Processes may also be performed in part automatically and in part manually unless otherwise indicated. In a given embodiment zero or more steps of a process may be repeated, perhaps with different parameters or data to operate on. Steps in an embodiment may also be done in a different order than the order of presentation shown in FIG. 3 or other examples herein. Steps may be performed serially, in a partially overlapping manner, or fully in parallel. The order and extent in which FIG. 3 is traversed and/or in which steps are performed during a process may vary from one performance of the process to another performance of the process. The flowchart traversal order and extent may also vary from one process embodiment to another process embodiment. Steps may also be omitted, combined, renamed, regrouped, or otherwise depart from the flow of a given example, provided that the process performed is operable and conforms to at least one claim.

Examples are provided herein to help illustrate aspects of the technology, but the examples given within this document do not describe all possible embodiments. Embodiments are not limited to the specific implementations, arrangements, displays, features, approaches, or scenarios provided herein. A given embodiment may include additional or different technical features, mechanisms, and/or data structures, for instance, and may otherwise depart from the examples provided herein.

In some examples, a data save technical process for saving data despite power loss includes detecting 302 a data save trigger condition 304 in a computing system 102, sending 326 a data save command 330 toward a volatile memory device, and providing 324 power to the volatile memory device from a shared power source. A shared power source is a power source that is shared between at least two volatile memory devices, neither of which has a dedicated power source in effect at the time of sharing. Detecting 302 a trigger condition may include detecting AC power loss for a specified period 306 (which may be previously programmed 308 based on battery characteristics), detecting an intentionally created 310 voltage drop 312, detecting an OS shutdown 318, and/or detecting an explicit command 322 to save data into non-volatile memory. OS shutdown and explicit data save may be implemented as notifications 320.

In some examples, the data save technical process also includes the volatile memory device that receives 328 a data save command performing 332 a data save operation 334, namely, an operation which saves data from volatile memory 122 into non-volatile memory 124. The data save operation is performed with the power provided 324 from the shared power source.

In some examples of the data save technical process, sending 326 a data save signal 330 includes dropping 310 a power supply output to a value 316 which is less than a normal operating power 314 but is still sufficient to power the volatile memory device during the data save operation 334. For example, voltage may be dropped 310 from a 12V normal level 314 to a lower level 316 that is within 10% of 12V, or at least 9.6V. In some examples, the drop 310 makes the voltage low enough for a controller to trigger a data save operation but not too low to power the data save operation.

In some examples, the process includes lowering 348 the output wattage of the power supplies 202, thereby providing a safety mechanism for operating batteries for an extended period.

In some examples, providing 324 power to the volatile memory device from the shared power source includes performing at least one method for coordinating 340 a voltage step down 342. Some examples are provided below.

Power Supply Coordination Method 1.

When AC is lost, the chassis 132 is informed and it lowers blade power to a point where the blade server can run on battery for an extended time, e.g., an amount of time that is at least long enough for NVDIMM backup 334 plus a buffer of at least one-sixth that amount. If AC doesn't return within 35 seconds, some embodiments turn off the power supplies 202. In some embodiments, 35 seconds after loss of AC, the power supply will look 356 at the output power it is providing. If it is below 75 Watts (or another configurable number that is less than normal wattage), the power supply will allow up to 200 seconds run time to allow NVDIMM backup.

Power Supply Coordination Method 2.

In some embodiments, 35 Seconds after AC loss, the power supplies will lower their voltage to ~11.5V to trigger 354 an NVDIMM backup 334. If power supplies do not lower 348 their voltage simultaneously, the power supplies that lower their voltage last will take all the load and could overcurrent and latch off. One way to avoid this is for the power supplies to monitor 356 timing after AC loss so they all lower voltage at approximately the same time. In addition, they can lower voltage over a window of 1-2 seconds and when they hit the max output current they can delay 340 the down ramp to let the other supplies 202 catch up. For instance, with 6 power supplies, power supply 1 starts dropping voltage first. Assume that power supply 1 at 11.8V reaches its max output current of 131 A. It will remain at 11.8V while the other supplies catch up and reach 11.8V. At that point the other supplies 202 will be sharing the load again so power supply 1 can resume 310 its voltage sag to 11.5V.

In some embodiments, the power supplies 202 will have a common signal called VDROP that will be monitored by all power supplies. Low=VDROP, HI=Normal output voltage. To coordinate 340 with one another, after loss of AC power the power supplies start a timer. Timing may be off by 10's of milliseconds between power supplies. The first power supply to reach 35 seconds will drop its voltage to 11.5V and pull VDROP low simultaneously. The remaining power supplies will see VDROP go low and will immediately drop their outputs too. The power supplies have a register that can disable VDROP if appropriate. This coordination 340 could also be accomplished using a chassis manager 206 where the chassis manager does the timing after AC loss and pulls VDROP low.

In some examples of the data save technical process, an NVDIMM performs 336 an asynchronous DRAM reset 338 (ADR) in response to the data save command 330. An ADR operation may follow a non-maskable interrupt (NMI) or other housekeeping operation which saves data from a CPU 110 cache into an NVDIMM volatile store. Data is flushed 358 from the processor cache into the NVDIMM volatile store by the NMI operation and then copied from there into non-volatile memory of the NVDIMM by the ADR operation.

In some examples, providing 324 power to the volatile memory device includes maintaining 344 power to a PCIe rail 211 and/or maintaining 344 power to a DIMM rail 209, and then removing 346 power to the rail(s) after the data save operation 334 is complete. In some examples, after commanded data save operations 334 are complete, power is removed 346 from the volatile memory devices and the computing system is reset 350 and (re)booted 352.

Configured Media

Some embodiments include a configured computer-readable storage medium 112. Medium 112 may include disks (magnetic, optical, or otherwise), RAM, EEPROMS or other ROMs, and/or other configurable memory, including in particular computer-readable media (as opposed to mere propagated signals). The storage medium which is configured may be in particular a removable storage medium 114 such as a CD, DVD, or flash memory. A general-purpose memory, which may be removable or not, and may be volatile or not, can be configured into an embodiment using artifacts in the form of data 118 and instructions 116, read from a removable medium 114 and/or another source such as a network connection, to form a configured medium. In some examples, a computer-readable storage medium 114 is configured with data and with instructions that when executed by at least one processor 110 and/or other programmable component (e.g., a CPLD) causes the programmable component to perform part or all of a technical process described herein. In particular, performance of any step, group of steps, or sequence of steps which is shown in FIG. 3 or otherwise disclosed herein may be performed under the control or influence of a computer-readable storage medium programmed accordingly.

For scope of disclosure purposes, the discussion under this "Configured Media" heading is deemed to be duplicated under the "Processes" heading, and the discussion under the "Processes" heading is deemed to be duplicated under this "Configured Media" heading. Moreover, processes are also discussed elsewhere in this disclosure, under neither heading. Headings are for convenience only; they do not limit the scope or content of the teachings herein.

Additional Examples

Additional details and design considerations are provided below. As with the other examples herein, the features described may be used individually and/or in combination, or not at all, in a given embodiment.

Those of skill will understand that implementation details may pertain to specific code, such as specific APIs, specific memory addresses, specific property and object names, and specific sample programs, and thus need not appear in every embodiment. Those of skill will also understand that program identifiers and some other terminology used in discussing details are implementation-specific and thus need not pertain to every embodiment. Nonetheless, although they are not necessarily required to be present here, these details are provided because they may help some readers by providing context and/or may illustrate a few of the many possible implementations of the technology discussed herein.

Some discussion herein is derived from some Windows® Cloud Server/Microsoft Cloud Server Specification documentation, which includes discussion of technology implemented by Microsoft Corporation (mark of Microsoft Corporation). Aspects of this software and/or documentation are consistent with or otherwise illustrate aspects of some of the embodiments described herein. However, it will be understood that such documentation and/or implementation choices do not necessarily constrain the scope of any examples or embodiments described herein, and likewise that Microsoft product code and components and/or their documentation may well contain features that lie outside the scope of such embodiments and examples. It will also be understood that some discussion herein is provided in part as an aid to readers who are not necessarily of ordinary skill in the art, and thus may contain and/or omit details whose recitation below is not strictly required to support the present disclosure.

In some examples, an NVDIMM 138 includes on-board DRAM, on-board NAND flash memory, and an on-board controller which will copy data from the DRAM to the NAND flash memory. In some embodiments, a distinction can be made between a normal operation power source and a backup operation power source for NVDIMMs and/or PCIe devices. In some embodiments, NVDIMMs are powered from a motherboard 128 during normal operation. In some embodiments during a backup of NVDIMM volatile memory to the NVDIMMs' non-volatile memory, NVDIMMs may be powered by dedicated supercaps or dedicated batteries, that is, a given supercap/battery is dedicated to a given NVDIMM for use only by that NVDIMM. In some embodiments, supercaps may be 12-18 inches away from the NVDIMM, connected to it by a cable. However, in some these embodiments, dedicated energy sources use real estate that is within a few inches of the NVDIMM and its motherboard and hence more valuable than real estate that is a foot or more distant from the motherboard. Supercaps may also impose cooling requirements not needed by NVDIMMs per se. Some embodiments described herein provide the low latency DRAM speed writes of NVDIMMS without over-provisioning of SSDs, by reducing or eliminating use of dedicated supercaps to power those NVDIMMs. Instead, chassis-level batteries 204 shared among multiple NVDIMMs are leveraged to provide suitable power, making expensive supercaps unnecessary.

Figure 4:
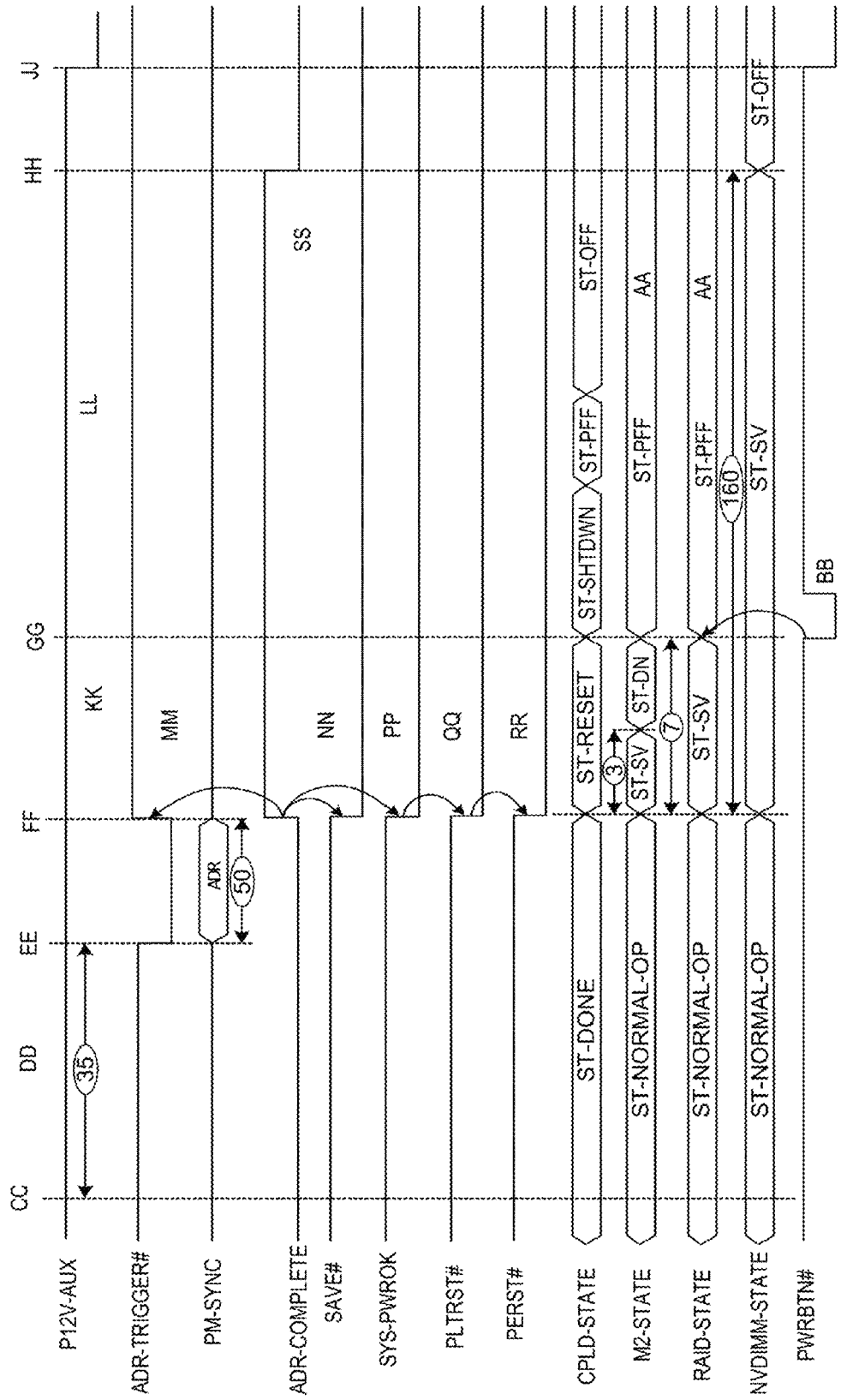
FIG. 4 shows a power sequencing timing chart.

Some examples utilize a remote or chassis level battery 204 to power 324 an NVDIMM save-to-flash operation 334. Some examples change power sequencing of the motherboard in one or more of these following ways: some power rails stay alive 344 for a period and others are powered off 346 straight-away; a management processor has authority to assert ADR; battery(ies) output voltage can invoke 310 ADR through voltage regulation after AC power is lost for a set period of time. FIG. 4 shows a timing chart for CPLD Power Sequencing for NVDIMM Support, illustrating the operation and firmware coding of some embodiments.

In some examples, FW supports any combination of RDIMMs and NVDIMMs. Some embodiments support 8 GB and 16 GB NVDIMMs. In some examples, one HDD is repurposed for housing capacitors. Some include an automatic trigger of NVDIMM backup to flash at low battery capacity. Some examples enable powersafe NVDIMM and PCIe devices. Some enable powersafe NVDIMM and PCIe devices in a cloud server. Some cloud server architectures provide non-limiting examples.

Powersafe Operation Examples

This portion of the disclosure focuses on powersafe implementation of NVDIMMs and PCIe devices on cloud servers. "Powersafe operation" is an example of configurable data save trigger functionality. This portion starts with a brief background on a cloud server chassis infrastructure, followed by an end-to-end description of a powersafe NVDIMM/PCIe device implementation. Discussion is provided of architectural, physical, mechanical, electrical, thermal, and software (e.g., BMC/BIOS) implementation aspects along with NVDIMM characteristics for supporting these powersafe devices in an example cloud server chassis.

Figure 5:
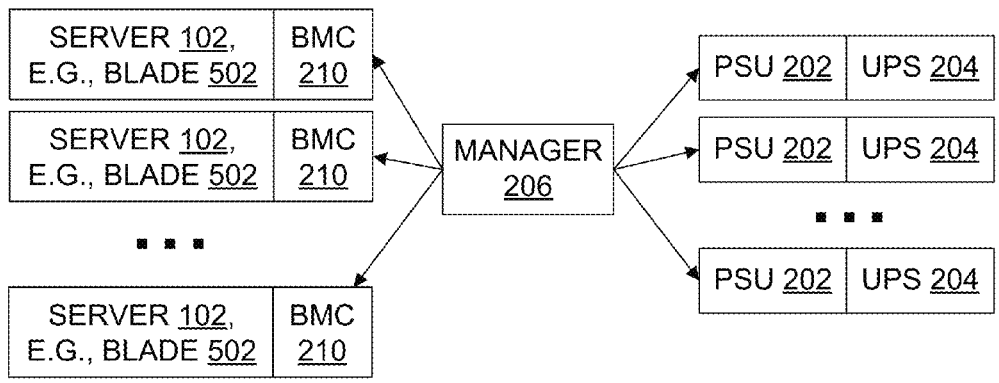
FIG. 5 is a diagram illustrating some aspects of a cloud server power and power management infrastructure.

FIG. 5 illustrates an architectural context for a cloud server and a chassis infrastructure. A frame manager 206, such as a chassis manager, communicates queries to controllers 210 of blades 502 or other server 102 systems/subsystems. The manager 206 manages a shared pool of PSUs 202 and UPSs 204. Thus, the cloud server chassis in a given example includes a certain number of servers or blades (such as 24), a shared pool of power supplies 202 and batteries 204 and a chassis manager 206 (a.k.a. chassis manager server). In this example, the chassis manager 206 communicates with the Baseboard Management Controller (BMC) 210 using IPMI over serial interface(s) and communicates with the power supply infrastructure (PSU/Batteries) using PMBUS over I2C interface. The chassis manager 206 uses these communication interfaces to query health and status information from the blades and the power supply/batteries.

Some cloud servers have a Hot Swap Controller (HSC) 208 which delivers 12V power voltage to the server. During power failure, chassis-level UPS batteries 204 are automatically engaged and the servers will seamlessly receive 12V input voltage. The chassis-level batteries are primarily used as a transition mechanism to Diesel Generator (DG) power or other local emergency generator power after a utility AC loss (power outage).

In some embodiments, powersafe operation is initiated 354 after waiting a DG transition time 306, e.g., 5-20 seconds. In some, DG transition time is 17 s (17 seconds) and cloud server batteries are provisioned to sustain primary DG failure and subsequent transfer to the secondary DG. This example translates into a battery hold-up time (enough capacity to sustain full chassis load) period of at least 34 s (2*17 s).

Each cloud server blade may include a certain number of powersafe devices such as NVDIMMs and PCIe devices (like RAID controllers, SSDs). These powersafe devices typically have volatile state (in DRAM/SRAM) which may not have been immediately persisted to the non-volatile medium during normal operation, in order to improve access latency. Such a powersafe device has an associated hold-up time for persisting its volatile state (data backup) after a power loss event. A power loss in the context of powersafe devices could be a utility outage event (and subsequent DG failure) or another power network failure event such as PDU/transformer failure, circuit-breaker trips, etc.

An operational hold-up time for the powersafe devices under these power loss events can be provided, for instance, using power from: (i) a local energy storage device such as capacitance or battery (typically embedded within the powersafe device or attached directly to the powersafe device), and/or (ii) a chassis-level UPS battery that is already available as part of a cloud server chassis infrastructure.

Some cloud servers support both these modes of device backup energy sourcing. Each of these modes of energy sourcing has associated feasibility considerations. While the local energy storage is primarily limited by physical space and cost constraints, the chassis-level battery has associated power and energy constraints.

This portion of the document will now describe some cloud server infrastructural changes (in chassis, blade, and accompanying software) that enable powersafe devices to successfully save their volatile state after a power loss and restore the state when power returns. An NVDIMM implementation and powersafe PCIe device implementation are discussed as examples.

NVDIMM Support

Some Technical Advantages of NVDIMM Support

Higher performance: NVDIMMs or Non Volatile DIMMs allow for fast access (order of magnitude latency improvement compared to traditional SSDs) to data in the memory while ensuring data persistence. Applications that rely on or benefit from low-latency memory writes (e.g., in-memory database commits, data caching for persistent data store, or transactional logs) can leverage NVDIMMs to optimize performance/dollar.

Lower cost: Today, write-intensive (to persistent store) applications typically overprovision SSD capacity to achieve endurance targets, resulting in increased cost, which can be reduced or avoided with NVDIMMs. Further, some cloud servers leverage a chassis-level battery as an alternative to expensive supercaps for reducing NVDIMM cost.

NVDIMM Operation

Some cloud servers will support NVDIMMs with DDR3 RDIMM DRAM and NAND flash based persistent backup. Some of these DIMMs have manufacturer specific interfaces that are managed by a Memory Reference Code (MRC). The NVDIMMs perform like normal DDR3 DRAM until the SAVE signal 322 is driven to the NVDIMM via the PCH. Upon receiving the SAVE signal, the NVDIMM will backup 334 the data in the DRAM to the NAND flash, typically using a FPGA/ASIC NVDIMM controller inside the DIMM module 138. This NVDIMM save or backup operation 334 is intended to be used in the case of a loss of power to the blade or based on explicit software request 322. When the NVDIMM goes into this state it is no longer usable from the operating system 142 until a subsequent blade restart 352. During the backup operation, the NVDIMMs can be powered either (i) using an external supercap (or an equivalent battery module) connected using a tethered cable to the NVDIMMs or (ii) using chassis-level UPS batteries using the 12V aux power from the motherboard. Note that during this backup/save operation, except for the NVDIMMs, all other server components (like CPUs, HDDs) can be powered down 346.

As part of a blade reboot process, the cloud server BIOS initializes the NVDIMMs. During this initialization, the BIOS will initiate restoration of data from the NAND flash back to the DRAM (if a valid backup image is present) by communicating with the NVDIMM controller. After the OS 142 gets control of the server, a suitable device driver will expose this NVDIMM memory region for use by system software.

An NVDIMM Implementation On Cloud Servers

This section describes example cloud server hardware and software implementations for enabling powersafe NVDIMMs. Discussion of the hardware implementation includes features pertaining to NVDIMMs, such as PCH, power-sequencing CPLD and signals between BMC, CPLD and PCH. Discussion of the software implementation includes features pertaining to the BIOS, BMC and logic inside a power-sequencing CPLD. Also included is a moderately high-level overview of an example cloud server motherboard (include BMC/CM) with hooks for implementing powersafe NVDIMMs devices, consistent with FIGS. 6 and 7.

Figure 6:
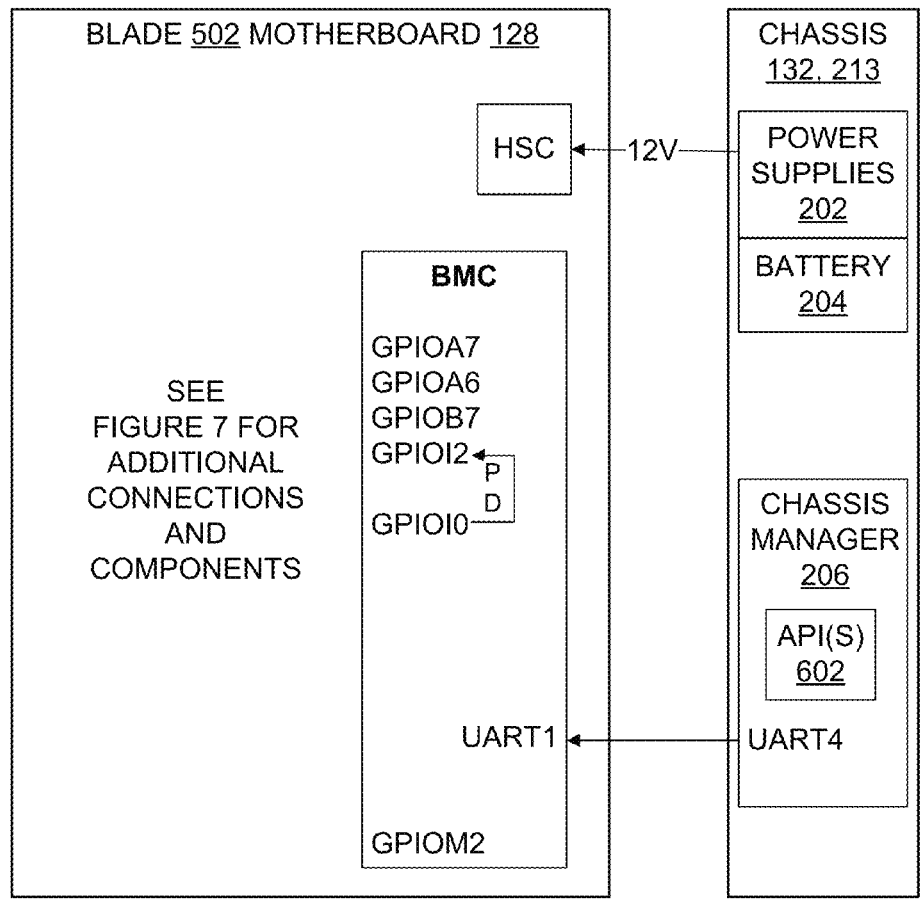
FIGS. 6 and 7 collectively illustrate a blade motherboard and an associated chassis.
Figure 7:
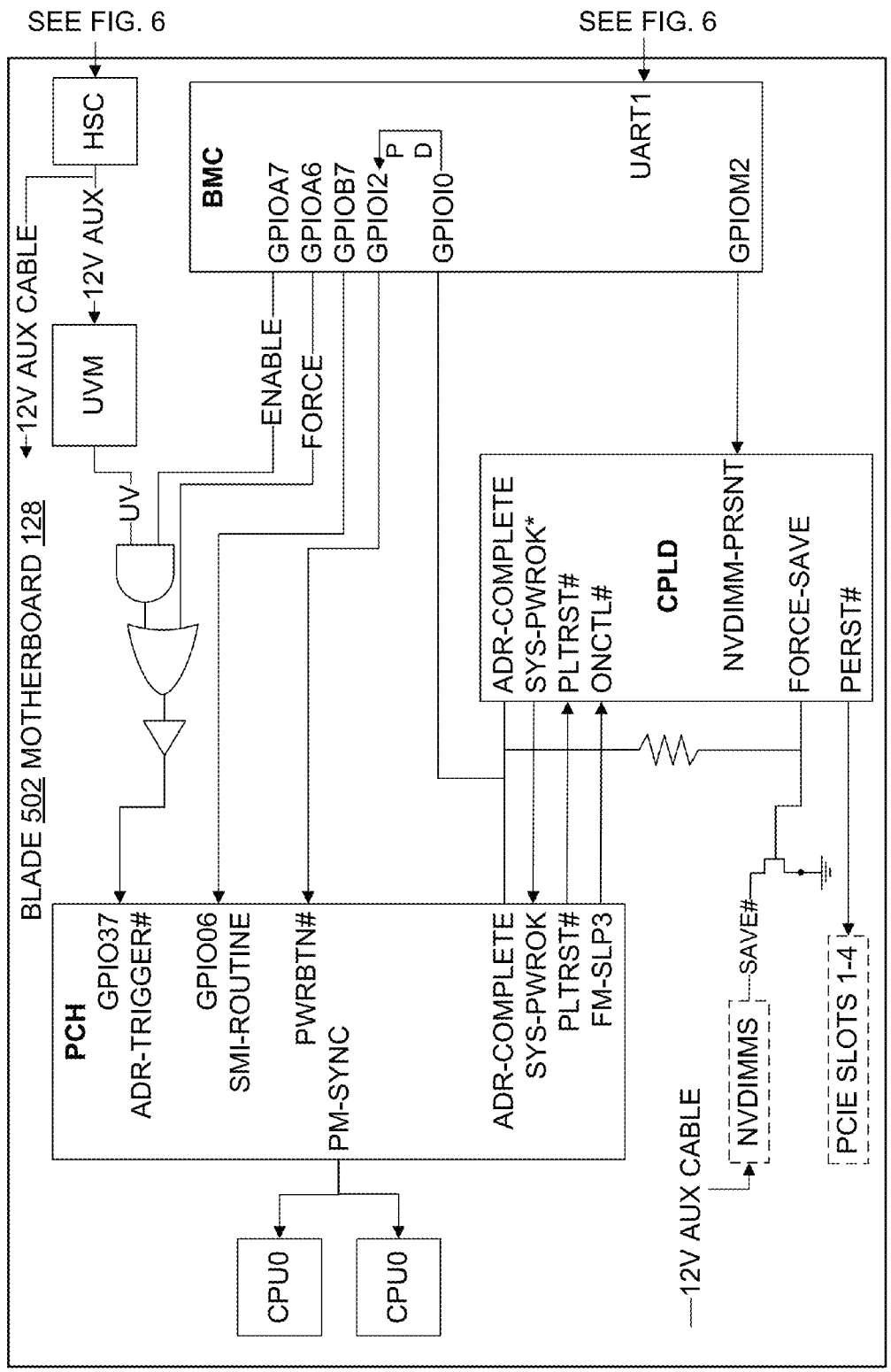

FIGS. 6 and 7 collectively illustrate a hardware schematic for an NVDIMM implementation on cloud servers. Note that in FIGS. 4 and 7, the pin and signal identifiers use hyphens (e.g., "ADR-COMPLETE") where the text uses underscores ("ADR_COMPLETE") for the corresponding items; this cosmetic adjustment is made for drawing consistency and to facilitate compliance with drawing format requirements for terms such as "ST-DONE" and "ST-RESET" in the FIG. 4 timing diagram. Also, in FIG. 7 UVM denotes Under Voltage Monitor, PD denotes Program Delay, and the asterisk after SYS-PWROK denotes "Gated by ADR_COMPLETE".

Figure 8:
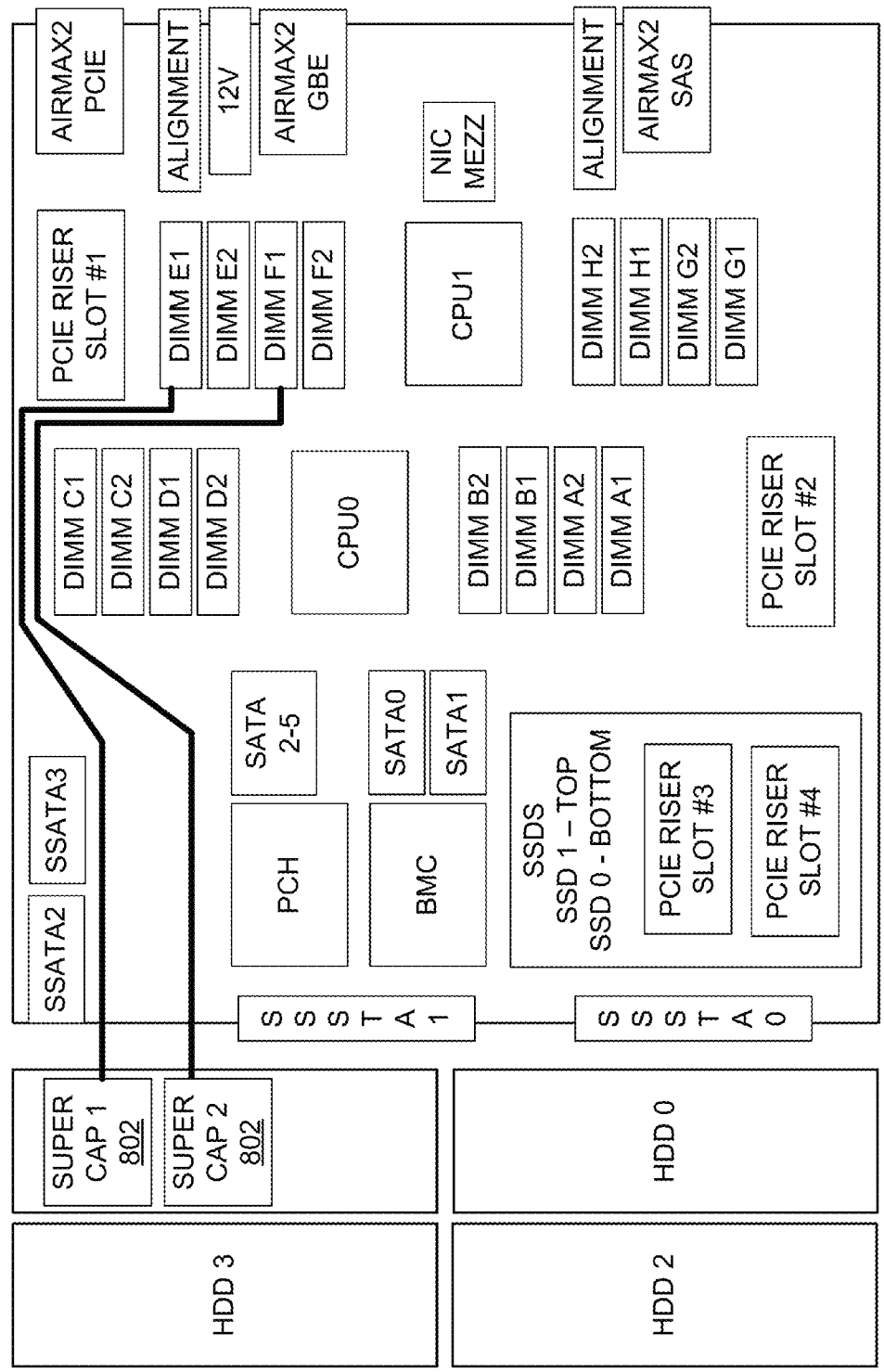
FIG. 8 shows a motherboard block diagram for an NVDIMM implementation on cloud servers using supercap backup sourcing.

As mentioned earlier, some cloud servers support three kinds of backup sourcing, (i) supercaps, (ii) chassis-level battery, and (iii) rack-level battery. FIG. 8 shows a sample configuration for an NVDIMM implementation on cloud servers using supercap 802 backup sourcing. In this implementation NVDIMMs are directly connected to the supercaps, which are placed in a HDD bay.

Figure 9:
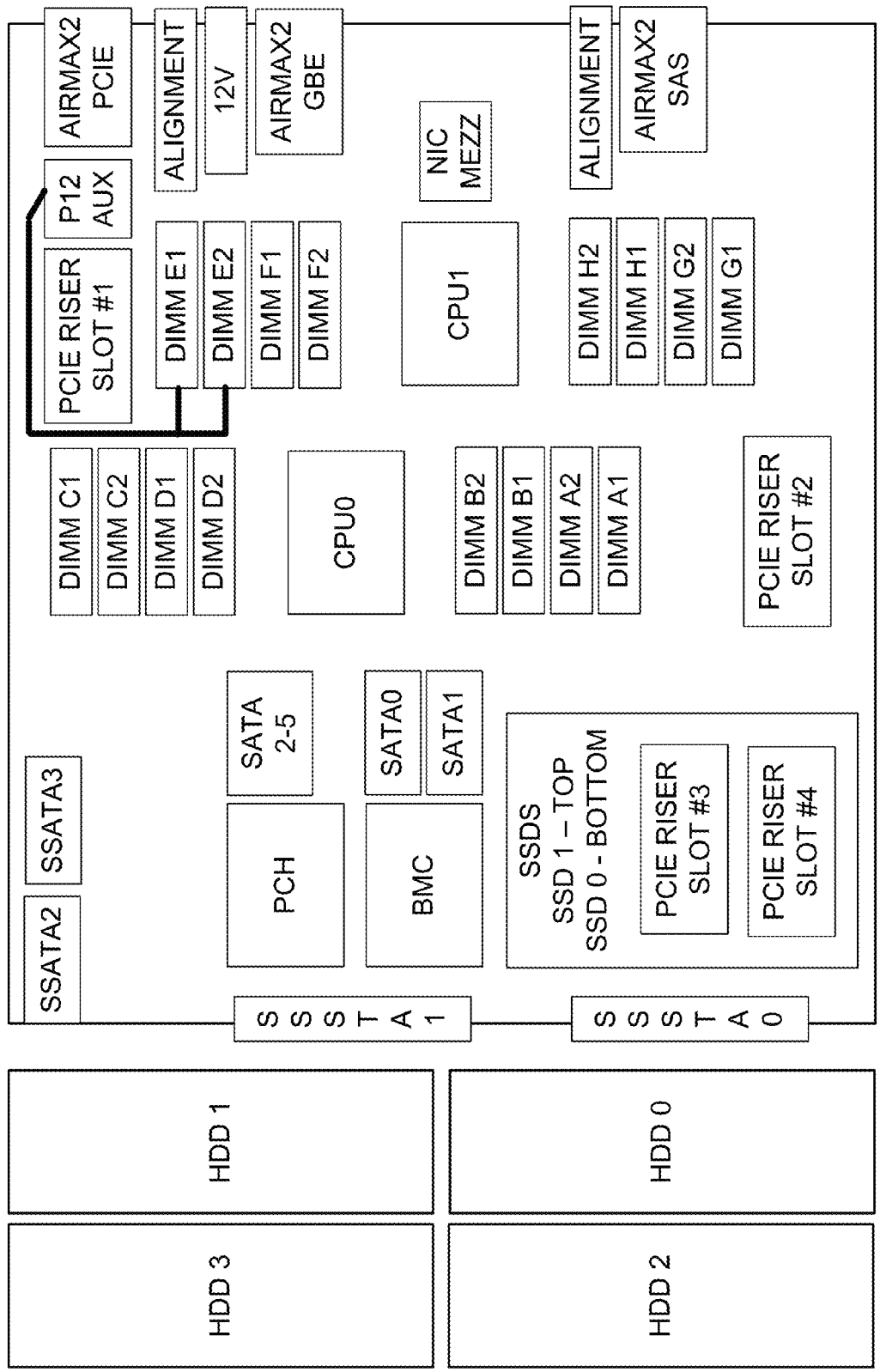
FIG. 9 shows a motherboard block diagram for an NVDIMM implementation on cloud servers using 12V auxiliary backup sourcing.

FIG. 9 shows a chassis-battery based backup configuration for an NVDIMM implementation on cloud servers using 12V Aux backup sourcing. In this implementation the 12V blade power input from the HSC is directly fed to the NVDIMMs. Some examples use a connector on the motherboard with pins 1 and 2 ground (2 A capacity), pin 3 12V auxiliary (2 A capacity), and pin 4 not connected.

The rest of this section provides a high-level overview of NVDIMM implementation on some cloud servers and detailed discussion of implementation of different hardware and software components. The discussion presents four aspects of operational states of NVDIMMs: NVDIMM/System Initialization, Normal operation, Backup operation, and Restore operation. Those of skill will also understand other implementations, and may use other descriptions of implementations that embody one or more of the teachings presented herein.

NVDIMM/System Initialization

Every time a cloud server starts (boot process), the following high-level initialization activities are performed for enabling NVDIMM operation.
(i) The cloud server BIOS detects the presence of NVDIMMs and populates a meminfo data structure or another data structure to indicate which DIMMs are NVDIMM capable.
(ii) The BIOS performs memory initialization (including NVDIMMs). As part of NVDIMM initialization, the BIOS (a) waits for any pending NVDIMM backup operation to complete, (b) may wait for the NVDIMM supercap to get sufficiently charged, and (c) restores an already existing backup NVDIMM image if such a backup image is present and valid.
(iii) The BIOS exposes the NVDIMMs to the OS as a non-volatile memory device by populating appropriate ACPI tables.

Meminfo Structure

In some implementations, the BIOS populates the meminfo data structure, indicating the presence or absence of NVDIMM in each of the motherboard DIMM slots. Optionally, the BIOS may also populate the presence of supercap support for the NVDIMMs as part of the meminfo data structure. This information about the presence of supercap(s) may involve a custom interface to the NVDIMM controller, such as the following:

Bit [5:0]: Type
00h: SDRAM
01h: DDR-1 RAM
02h: Rambus
03h: DDR-2 RAM
04h: FBDIMM
05h: DDR-3 RAM
06h: DDR-4 RAM
07h: DDR-3 NVDIMM
08h: DDR-4 NDVIMM -continued 09h: DDR-3 NVDIMM with Supercap
0Ah: DDR-4 NVDIMM with Supercap
3Fh: No DIMM present
...

The BMC will read the meminfo data structure immediately after the BIOS has communicated this meminfo structure via KCS (keyboard controller style) or BIOS to BMC protocol. The BMC will subsequently use this information for performing the NVDIMM backup operation(s).

Exposing NVDIMMs to OS

Listed below are some preliminary BIOS characteristics for NVDIMM OS support in one example; BIOS characteristics may differ in other examples. By providing these characteristics, a kernel 142 can present a block storage view of a NVDIMM module (or series of modules) such that OS applications can use it as a regular storage device. That is, NVDIMM can be identified as a disk type device, can be partitioned, can be mounted and can be used in much the same way as any other storage device presented to the system.

Item 1. If the firmware/BIOS uses an MRC library that has support for NVDIMM without any modification, or otherwise already supports NVDIMM, then go to item 4.

DDR3 NVDIMMs are commercially available from various vendors. One of skill in the art will understand that the teachings presented herein apply to systems, devices, and methods which include or utilize products from a variety of vendors and that embodiments are not limited to those with products of the particular vendors mentioned herein. In some examples, all NVDIMMs reside in a separate contiguous system address space from the space occupied by DRAM. An example may check for any saved image on a NVDIMM and initiate a restore if a valid saved image is found. An example may check the supercap charge status and wait for supercap to be fully charged before continuing boot. NVDIMMs may be interleaved in some examples. Interleaving may use an all or nothing approach that applies to both regular DIMMs and NVDIMMs. The interleaving setting may have impact on the objects present in the ACPI table.

Item 2. During memory device detection, identify all of the supported NVDIMMs and put all NVDIMMs into a separate contiguous system address space from the system address space occupied by DRAM. The memory bus timings of NVDIMMs can be different from regular DIMMs.

Item 3. For all supported NVDIMMs, the following functionalities are present in this example. Check for any saved image on a NVDIMM. If there is a valid saved image, initiate a restore operation. Provide an option to force the firmware/BIOS to wait for backup power to be sufficiently charged before proceeding with boot. If backup power is a supercap, firmware/BIOS will check the supercap charge status and wait for supercap to be full charged before proceeding with boot. Provide an option to erase and arm the NVDIMM for save operation. If this option is enabled, the firmware/BIOS will erase the NAND on the NVDIMM after restore operation has been completed. After erasing the NAND, the firmware/BIOS will arm the NVDIMM for a save operation. Provide an option to enable/disable interleaving across NVDIMMs. Interleaving of NVDIMMs can be across all NVDIMMs in the system or all NVDIMMs attached to a specific memory controller. If both options are supported, provide a configuration option to choose the desired interleaving. The interleaving option can impact objects present in the ACPI table.

Item 4. On UEFI machines, the memory region occupied by the NVDIMM(s) is marked with the type EFI_MEMORY_TYPE 14 (this is currently a reserved value). On BIOS machines, the memory region is marked with the value of 7 (this is currently a reserved value) in the E820 table. This will tag the memory region as not usable by the OS. These are example marking values; other implementations may use other available values.

Item 5. If Fault Resilient Booting (FRB) is supported, ensure the FRB timing values can accommodate the extra boot time for a NVDIMM to restore its contents or to wait for the supercap to be fully charged.

Item 6. Ability to trigger an ADR save on orderly shutdown of the system to save the NVDIMM content to NAND. On the following power-on, there will be a restore of saved data on the NVDIMMs, in this example.

Item 7. ACPI DSDT or SSDT table(s) presented to the OS contain at least one NVDIMM ACPI object described in the ACPI Object Definition section. If interleaving of NVDIMM is disabled, there is one NVDIMM ACPI object per NVDIMM in the system, in this example.

Additional information which may be used includes information on the flows for initialization of the NVDIMM and charging the alternate power source (if applicable), information on BIOS restore behavior and conditions for restore in the light of failures, and information on NVDIMM failure modes and BIOS behavior in those scenarios. Specifications for, and access methods for, the embedded controller on the NVDIMM module itself, may include the register definition and management capabilities.

ACPI Object Definition

In order for an OS 142 to discover the presence of NVDIMMs 138 and determine whether the OS is to load a block storage driver, the BIOS exposes an ACPI Object in this implementation. The ACPI object is in the DSDT or SSDT table and live under the _SB namespace. It supports the following ACPI methods. This will allow a driver to load and expose the NVDIMM region as a block storage device.

_HID (Hardware ID)—the hardware ID is a string and is based on information in the SPD (Serial Presence Detect) table. The format of the _HID is the string XXXXYYYYYYYY where XXXX and YYYYYYYY has the following information. XXXX is the ASCII representation of the bytes 117-118 from the SPD if there is a single NVDIMM. For multiple NVDIMMs, XXXX is set to "NVDM". YYYYYYYY is the ASCII representation of the CRC32 hex value of bytes 128 to 145 from the SPD if there is a single NVDIMM starting with the MSB of the CRC32 value. For multiple NVDIMMs, YYYYYYYY is the ASCII representation of the CRC32 hex value generated from a concatenation of bytes 117-118 and bytes 128 to 145 from the SPD of all the NVDIMMs associated with this object based on DIMM slot order. CRC32 hex value is MSB first and DIMM slot order is from lowest number slot to highest number slot.

_CID (Compatible ID)—the compatible ID is the string "PNP0C90".

_ADR (Address)—an integer that maps to the DIMM slot starting from 1. The value 0 is used if there are multiple NVDIMMs associated with this object.

_UID (Unique ID)—the unique ID is a string and is based on information in the SPD. The format of the _UID is the string YYYYYYYY. For single NVDIMM, YYYYYYYY is the ASCII representation of the CRC32 hex value of bytes 117 to 125 from the SPD starting with the MSB of the CRC32 value. For multiple NVDIMMs, YYYYYYYY is the ASCII equivalent of the CRC32 hex value generated from a concatenation of bytes 117 to 125 from the SPD of all the NVDIMMs associated with this object based on NVDIMM slot order. CRC32 hex value is MSB first and slot order is from lowest number slot to highest number slot.

_HRV (Hardware Revision)—the hardware revision is an integer and is based on information in the SPD. For single NVDIMM, _HRV is the bytes 146-147 from the SPD. For multiple NVDIMMs, _HRV is the CRC32 value generated from a concatenation of bytes 146-147 from SPD of all NVDIMMs on the system based on NVDIMM slot order. Slot order is from lowest number slot to highest number slot.

_CRS (Current Resource Settings)—a buffer describing the memory resource associated with the NVDIMM. The buffer contains an Extended Address Space Descriptor that is a memory range resource type describing one contiguous address range used by the NVDIMM(s) associated with this object. ACPI_MEMORY_NV type specific attribute is set. Other memory type attributes (e.g. ACPI_MEMORY_UC) may be set if applicable.

_STA (Status)—an integer returning the current status of a device. If NVDIMM(s) associated with this object is usable, return value 0x1f. If the NVDIMM(s) associated with this object is not usable, return 0.

_MGT (Management)—this is a placeholder function to return more detailed information about the state of the NVDIMMs. This may be replaced by a _DSM method instead that provides the following: Initiate a save operation, Query for save/restore status, Query for supercap charge status, Query for temperature, Configure device fault notification.

Below is a sample ASL definition of the NVDIMM object for a 4 GB address range: 0x1.4000.0000-0x02.3FFF.FFFF

```
Device(\_SB_.NVD_) {
   Name(_ADR, 0x2)
   Name(_HID, "04D501234567")
   Name(_CID, "PNP0C90")
   Name(_UID, "01234567")
   Name(_HRV, 0x1)
   Name(_CRS, Buffer(0x3a)
   {
      0x8b,      // Extended Address Space Descriptor
      0x35, 0x00, // length bits 0x35 = 53 byte
      0x00,      // Resource Type = Memory Range
      0x0d,      // General Flags = 1101
      0x09,      // Type Specific Flags = 1001
```

```
        0x00,       // Revision ID
        0x00,       // Reserved
        0x00, 0x00, 0x00, 0x00, 0x00, 0x00, 0x00, 0x00,   // _GRA : Address
Space Granularity
        0x00, 0x00, 0x00, 0x40, 0x01, 0x00, 0x00, 0x00,   // _MIN : Address Range
Minimum
        0xff, 0xff, 0xff, 0x3f, 0x02, 0x00, 0x00, 0x00,   // _MAX : Address Range
Maximum
        0x00, 0x00, 0x00, 0x00, 0x00, 0x00, 0x00, 0x00,   // _TRA : Address
Translation offset
        0x00, 0x00, 0x00, 0x00, 0x01, 0x00, 0x00, 0x00,   // _LEN : Address
Length = 4G byte
        0x04, 0x80, 0x00, 0x00, 0x00, 0x00, 0x00, 0x00,   //_ATT : Type Specific
Attribute
        0x79, 0x0                                // end tag for
resource list
    })
    Method(_STA, 0x0, NotSerialized) {
        Return(0x1f)
    }
    Method(_MGT, 0x0, NotSerialized) {
        Return(0x1f)
    }
}
```

Note that the specific CRC32 algorithm used doesn't matter for this example as long as it results in a 4 byte value.

Normal Operation

Normal operation pertains to the state where NVDIMMs appear as normal DIMMs from the perspective of the system software, offering the same performance as normal DIMMs.

OS to BIOS to NVDIMM: During normal operation, NVDIMM controller will respond to BIOS/OS interface calls via an SMBUS interface. Some examples include DSM method(s), e.g., using ACPI calls, for getting NVDIMM health info. BIOS has direct access to the SMBUS.

NVDIMM to OS/BIOS: The NVDIMM may also send SMALERT signals to the host CPU based on different alert events. This may include leveraging temperature sensor signals on the DIMM.

Backup Operation

Backup operation involves a state where the NVDIMMs save their volatile state from the DRAM to the integrated NAND flash in the DIMM. Various steps that are involved as part of the NVDIMM backup operation are described below. They can be organized into three main blocks, which can be viewed as steps, or viewed as collections of steps or events.

Block 1: Trigger Backup. This involves 12V power loss, blade poweroff (via CM), battery drain (via CM), and OS shutdown.

Block 2: Initiating Backup. This involves signaling CPU to stop memory access (PM_SYNC), flushing I/O buffers and memory buffers, and starting NVDIMM backup.

Block 3: Powering Backup. This involves keeping the system 102 in reset mode for 5-10 s for PCIe devices 136 to backup, and NVDIMMs being directly connected to supercaps or 12V aux power for backup.

Backup Example Step 1—Triggering Backup. Some backup trigger sources in some examples include a critical battery threshold, under voltage at the blade, and datasafe poweroff CM APIs 602. One or more of these may trigger 354 a cloud server or other server 102 backup. In an NVDIMM, backup may include backing up data from DDR3 DRAM to NAND flash in the NVDIMM. This backup process can be initiated in some cloud servers by these three main events. However, apart from these events, some internal events such as THERM_TRIP may also trigger 354 the backup operation.

Reference is made below to the CPLD timing diagram shown in FIG. 4. Some cosmetic formatting changes have been made in that diagram from the diagram that was provided in the underlying provisional application as FIG. 12, in order to facilitate compliance with patent drawing format requirements. For instance, underscores in identifiers have been replaced by hyphens. Lower case letters have also been capitalized, some text has been replaced by placeholders, and other cosmetic changes have been made. The correspondence is detailed below:

P12V-AUX denotes: P12V_AUX
    ADR-TRIGGER# denotes: ADR_TRIGGER#
    PM-SYNC denotes: PM_SYNC
    ADR-COMPLETE denotes: ADR_COMPLETE
    SYS-PWROK denotes: SYS_PWROK
    CPLD-STATE denotes: cpld_STATE
    M2-STATE denotes: M.2_STATE
    RAID-STATE denotes: RAID_STATE
    NVDIMM-STATE denotes: NVDIMM_STATE
    ST-DONE denotes: st_DONE
    ST-NORMAL-OP denotes: st_Normal_OP
    ST_RESET denotes: st_RESET
    ST-SV denotes: st_SAVE
    ST-DN denotes: st_DONE
    ST-SHTDWN denotes: st_SHUTDOWN
    ST-PFF denotes: St_PCH_off (sic st_PCH_off)
    ST-OFF denotes: st_OFF
    35 in an oval denotes: 35 s
    50 in an oval denotes: 50 us
    3 in an oval denotes: <3 s
    7 in an oval denotes: <7 s
    160 in an oval denotes: <160 s
    AA denotes: System power is Off
    BB denotes: BMC disables power when M.2 and RAID Save is complete [newline] CPLD state machine shuts down power
    CC denotes: AC Power Fail Trigger Event
    DD denotes: CM [chassis manager] monitors AC power for recovery
    EE denotes: CM asserts ADR_TRIGGER#
    FF denotes: PCH asserts ADR_COMPLETE GG denotes: BMC disables power after M.2 and RAID Save is complete HH denotes: NVDIMM Save completed JJ denotes: PSU disables 12V [newline] Delay Time Programmed in PSU KK denotes: Timer in BMC LL denotes: Timer in BMC MM denotes: ADR_COMPLETE deasserts ADR_TRIGGER#

NN denotes: CPLD asserts SAVE# initiating NVDIMM SAVE

PP denotes: ADR_COMPLETE deasserts SYS_PWROK to PCH

QQ denotes: PCH asserts platform reset to system (CPLD)

RR denotes: CPLD asserts PERST# initiating M.2 SAVE

SS denotes: ADR deasserts when power is removed

Event 1. Detection of 12V power loss from the HSC (this applies only to supercap). This method of triggering NVDIMM backup predominantly applies when supercap or local energy storage is used as a backup energy source for the NVDIMMs. As shown in FIGS. 4 and 7, the undervoltage monitor (UVM) circuit after the Hot Swap Controller (HSC) monitors the 12V input voltage to the server and asserts ADR_TRIGGER (GPIO37) on the PCH once the input voltage reaches 11.2V, for example (other voltages may be used in other embodiments). Some cloud servers use this under voltage detection as an indication of power loss, resulting either from the loss of AC power in the chassis PSUs or from physically removing the blade from the chassis. The blade BMC has an ability to disable this under voltage event based ADR_TRIGGER by clearing the enable on GPIOA7 (this will be done for chassis battery based NVDIMM backups). FIG. 4 illustrates some suitable logic. Triggering NVDIMM backup through the comparator for detecting voltage loss from the HSC can be invoked by voltage regulation from the chassis level power supplies with battery backup when NVDIMMS with no supercapacitors are used. After a given time period of running on batteries, if the Chassis Management module 206 has not triggered the ADR, the chassis battery supply can lower the output voltage to a level below the ADR trigger threshold of the comparator.

Event 2. Explicit ADR command from the Chassis Manager (CM) via the BMC. The CM triggers NVDIMM backup based on two categories of events. As to a first category, the CM monitors battery capacity and when the battery reaches a certain critical threshold (say after sourcing from battery for 35-40 seconds following an AC loss), it sends an explicit NVDIMM backup trigger via the IPMI (Set_NVDIMM_Trigger) command to all blades 502 in the chassis with NVDIMM. If for any reason the Chassis Manager fails to invoke the ADR trigger after the batteries have reached a critical threshold, the batteries 204 can lower 310 their output voltage to a point 316 below the power loss detection of the comparator or hot swap controller, automatically invoking ADR trigger. Under this configuration the batteries may remain at the output voltage level or return to 12V, however it is expected that PCIe devices and NVDIMMs will operate at the comparator voltage level outlined in Event 1 above.

As to a second category, the CM invokes explicit NVDIMM backup on a server whenever it receives a user request to remove power to the server. The CM exposes three main interfaces for datacenter operators to remove power to cloud servers (listed below): (i) datasafesetpoweroff removes 12V power to the server, (ii) datasafesetbladeoff removes power to the server motherboard while not affecting the 12V input power, and (iii) datasafesetbladeactivepowercycle removes motherboard power and subsequently re-enables power to the blade. The CM also has corresponding power ON APIs 602, consistent with examples listed below, for powering on the blades without affecting any pending datasafe backup operation. For servers with NVDIMMs (identified using the meminfo data structure), the CM intercepts these two blade power related interfaces and triggers NVDIMM backup by sending the Set_NVDIMM_Trigger IPMI command to the blade BMC. The original user request for removing blade power will only be executed after backup operation is complete.

DatasafeSetBladeOff(int bladeId);
DatasafeSetBladeOn(int bladeId);
DatasafeSetPowerOff(int bladeId);
DatasafeSetPowerOn(int bladeId);
DatasafeSetBladeActivePowerCycle(int bladeId);
GetBladeDatasafePowerState(int bladeId);

Event 3. Explicit ADR command from the host software (BIOS/OS) via the BMC. The BIOS (or the OS) can invoke NVDIMM backup operation by asserting ADR_TRIGGER on the PCH via the BMC. The BIOS achieves this by communicating to the BMC (via IPMI command) using the KCS interface. This method is typically used by the BIOS as part of its normal shutdown sequence. This ensures that the volatile state in the NVDIMMs is backed up before the NVDIMMs lose power as part of the transitioning to S5 shutdown power state. Note that a server restart does not require NVDIMM backup since power is not lost to the NVDIMMs. In some embodiments, cloud servers do not support hibernation, in view of ADR.

Backup Example Step 2—Initiating Backup

In some cases, a memory self-refresh precedes ADR_COMPLETE. Once ADR_TRIGGER is asserted on the PCH by one of the alternative methods discussed above, the PCH performs some backup-initialization/cleanup activity before starting the NVDIMM save process. This cleanup activity includes sending PM_SYNC to the CPUs for suspending memory operations, flushing memory controller buffers, flushing IIO PCIe buffers and flushing DIMM row registers. In order to ensure that all these volatile states are flushed into the NVDIMMs, some embodiments wait for a programmed delay of 200 us (for example) in the PCH (after ADR_TRIGGER is received) before starting the NVDIMM save process by triggering SAVE signal on the NVDIMMs. If PCH B0 stepping only allows for a 60 us delay timer, for example, then some implementations add a delay of 140 us between ADR_COMPLETE and SAVE as shown in the power sequencing CPLD in FIG. 4. This additional delay can be avoided in other implementations, e.g., with PCH B1 stepping that allows up to 800 us delay timer, thereby allowing ADR_COMPLETE to be connected directly to the SAVE pin on the NVDIMMs. Some NVDIMM software implementations use non-temporal stores and therefore do not require CPU data cache flushing.

This period of 200 us (200 microseconds) of cleanup time implies a server hold up time of at least 200 us between the ADR_TRIGGER event and when the system voltage rails power down, which is indicated using the PWRGD_PS_PWROK signal. This permits a supercap-based NVDIMM backup operation (triggered via HSC under-voltage circuit) in some embodiments. Some implementations set a voltage threshold for the PWRGD_PS_PWROK signal to allow for 200 us hold up time (based on having enough capacitance in the server motherboard to sustain full server load for 200 us) between ADR_TRIGGER and PWRGD_PS_PWROK.

Based on empirical measurement, this threshold voltage for PWRGD_PS_PWROK is determined to be 10.2V (the value may differ in some embodiments, e.g., may be as low as 9.6V). In the case of battery based NVDIMM backup, the chassis-level batteries can be used to power the entire server for 200 us after ADR_TRIGGER. The 200 us is an example; those of skill will ascertain corresponding times for other implementations.

Backup Example Step 3—Powering Backup

After the backup is initiated using the ADR_COMPLETE/SAVE signal to the NVDIMMs, the motherboard voltage rails can be safely shutdown (but some examples still keep the voltage rails active for few seconds for some PCIe devices) since the NVDIMMs are directly connected to the backup power source, both in the case of supercaps and chassis-level batteries.

During the backup operation, steps are taken to help ensure that the backup operation is uninterrupted. In particular, one may prevent any attempt to power down the cloud server (cut off power to the HSC) during the backup operation. Some cloud servers achieve this using a combination of blade BMC and chassis manager (CM) implementation which is detailed below.

Additional Implementation Details for Some Embodiments

CM Changes. In some embodiments, there are two additional NVDIMM related IPMI messages that the CM implements. These messages are described below.

Set_NVDIMM_Trigger—This message is used both to configure the NVDIMM triggering mechanisms described above and to cause the assertion of a GPIO on the BMC to cause the NVDIMM save.

Get_NVDIMM_Trigger—This message is used to query the current state of the NVDIMM configuration from the BMC.

In addition, the CM is responsible for enabling or disabling the under-voltage driven ADR_TRIGGER signal from the HSC. The CM will send the Set_NVDIMM_Trigger command to the BMC with byte 1 set to 00 h to disable the ADR_TRIGGER from the HSC.

The CM 206 monitors battery capacity and when the battery reaches a certain critical threshold (e.g., after sourcing for 35 seconds followed by an AC loss), it sends an explicit NVDIMM backup trigger via the ADR IPMI (Set_NVDIMM_Trigger) command to all blades with NVDIMM (identified via meminfo data structure for each blade). The BMC responds to this command with the amount of time the CM will wait before performing any power operations on the NVDIMM blades.

The CM also sends an explicit ADR IPMI (Set_NVDIMM_Trigger) command to a NVDIMM blade when it receives a blade power state altering command such as SetPowerOff or SetBladeOff command for that blade. The CM will then wait for the amount of time specified by the BMC in response to the Set_NVDIMM_Trigger command before executing the actual user command.

The CM sets the Nvdimm_Backup_Delay duration (estimated time to complete entire backup) in the BMC based on the contents of the meminfo structure—presence of NVDIMMs and presence of supercaps (on one or more DIMMs on the server).

BMC Changes. When the BMC receives the IPMI Set_NVDIMM_Trigger message it asserts GPIO37 on the PCH for driving ADR_TRIGGER. The BMC will read the meminfo structure after it has been communicated by the BIOS using the KCS interface. The BMC will communicate the meminfo structure to the chassis manager upon request.

As shown in FIG. 4, the BMC is notified of a NVDIMM backup operation by connecting the ADR_COMPLETE signal to BMC GPIO10. After the notification of the ADR_COMPLETE signal, the BMC will wait for a predetermined amount of time (e.g., 5-10 s) before deasserting FM_BMC_ONCTL# pin on the CPLD, which resets the entire motherboard 128. This is for supporting datasafe operation for the PCIe devices 136. After deasserting the FM_BMC_ONCTL, the BMC runs an internal timer for a certain duration (Nvdimm_Backup_Delay seconds) to ensure sufficient time for NVDIMM backup. The BMC firmware will have a default value for this parameter (200 s) and this can also be configured from the CM using the set_ADR_Trigger IPMI command. (Any of the time periods used in the examples may be altered and/or be programmed or otherwise configured differently in a given alternate embodiment). During this wait time, the BMC's IPMI command request-response is altered in two main ways. First, any blade power command (from the CM or in-band from the blade) is responded with a failure notification, unless an explicit nvdimm-backup-override flag is provided. Second, the ADR IPMI command from the CM is responded with a time-delay value (in seconds) that indicates the amount of time the CM 206 will wait before it can send any blade power off command. This time-delay value denotes the amount of time remaining (in the overall Nvdimm_Backup_Delay seconds wait period) in the NVDIMM save operation.

BIOS Changes. Code now populates a meminfo structure with NVDIMM/Supercap presence information. Code also provides an ability to trigger an ADR save on orderly shutdown with a corresponding restore of the saved data on power-on. During restart, the BIOS does not trigger ADR.

Figure 10:
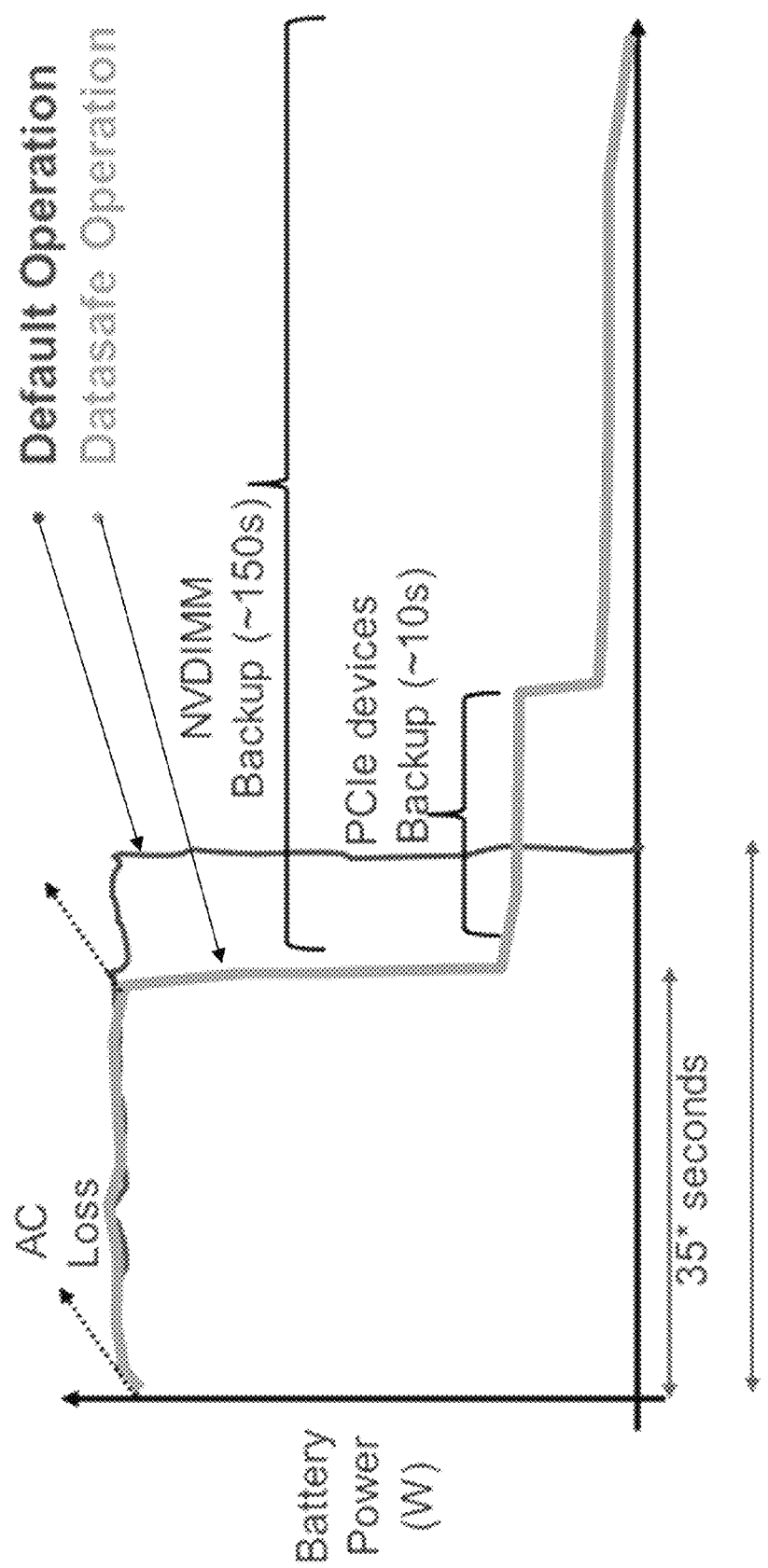
FIG. 10 is a graph illustrating battery operation with local energy storage in the form of a frame-level power supply and battery infrastructure.

PSU/Battery firmware changes. The PSU firmware behavior after AC power loss is as follows. It waits for 38 s after AC loss (if Diesel generator did not take the load within this time, NVDIMM backup is assumed to have been initiated by the CM). It checks if battery output power goes below 75 W per battery. If not, shutdown batteries. If battery output power is less than 75 W, extend the runtime of battery by 200 more seconds (after which the batteries will be shut down). During this period, the firmware continuously checks battery power and shuts down if the battery is greater than 75 W. Note that shutting down the batteries after the above-mentioned battery discharge (as opposed to letting it completely drain out of charge) is done to prevent battery deep-discharge and the consequent premature battery failure. FIG. 10 illustrates battery operation using a graph of a virtual battery implementation (i.e., a simulation) with local energy storage in the form of a chassis-level PSU/battery infrastructure. Some other frame-based power-supply and battery infrastructures are qualitatively similar in behavior but have different times and voltage levels than the FIG. 10 example.

This approach translates into at least two constraints for chassis battery based NVDIMM backup sourcing. First, the power consumption of each cloud server during NVDIMM backup is restricted to less than 18.75 W (75 W*6/24, assuming 6 batteries and 24 servers using NVDIMM). Second, once the cloud server enters the NVDIMM backup operation mode, the maximum amount of time it can be under this state is restricted to 200 seconds.

Also note that the 12V aux connector in this example supports a maximum power of 24 W or 2 Amps across all the NVDIMMs in the server. Other implementations may differ.

Error handling. Log error events. React to backup errors only on memory initialization (during server boot process).

Restore Operation

NVDIMM restore operation (copying data from NAND flash in the NVDIMM to the DRAM) occurs as part of a server boot process after power is restored to the server. Although AC power can potentially be restored before the NVDIMM backup operation is complete, one cloud server BMC will ensure that power is completely removed from the server after the backup operation is complete (by deasserting FM_BMC_ONCTL after waiting for Nvdimm_Backup_Delay). An explicit command to power (and restart) the blades is used (from datacenter operators through the CM APIs 602) after the backup operation has completed. The BMC will restore power to the blade motherboard 128 either after receiving an explicit 'blade power on' IPMI command or after the BMC itself is reset.

The BIOS will begin execution as part of the server reboot process. The BIOS, after initializing the NVDIMMs 138, will attempt to restore the NVDIMM backup data if a valid backup image is present. Any error that occurred during the NVDIMM backup process will be communicated by the NVDIMM controller to the BIOS at this stage. The BIOS will also be made aware of errors that occurred as part of restore operation. These errors will be recorded by the BIOS in a blade's system event log.

As part of the NVDIMM restore operation, the BIOS ensures that the contents of the DIMM portion of the NVDIMM is not modified/corrupted (that is, power is not lost to the NVDIMMs 138 as part of restart). Depending on the configuration, the BIOS may or may not wait for the supercaps to get sufficiently charged (for subsequent power-loss/backup) before initiating the restore operation (an NVDIMM controller may communicate the supercap charge-level to the BIOS). After the restore operation is complete (via notification from the NVDIMM controller), the BIOS will hand over control of the NVDIMMs to the OS.

Power Safe PCIe Devices

PCIe Devices in Cloud Servers

Some cloud servers have M.2 SSDs and RAID controllers which internally use DRAM for improving write performance; this DRAM is to be safely persisted after power loss. For instance, some RAID controllers use up to 2 GB of DRAM which may take up to 15 seconds for flushing to persistent medium upon power failure. Traditionally, these PCIe devices use custom supercap energy storage devices to perform volatile state backup. Some cloud server embodiments described herein leverage chassis-level and/or rack-level UPS batteries for performing backup in PCIe devices, thereby reducing or eliminating the cost overhead from supercaps.

Power Safe PCIe Devices Implementation

The powersafe implementation of PCIe devices are similar to that of NVDIMM, with some differences noted below.

Powering Backup

Figure 11:
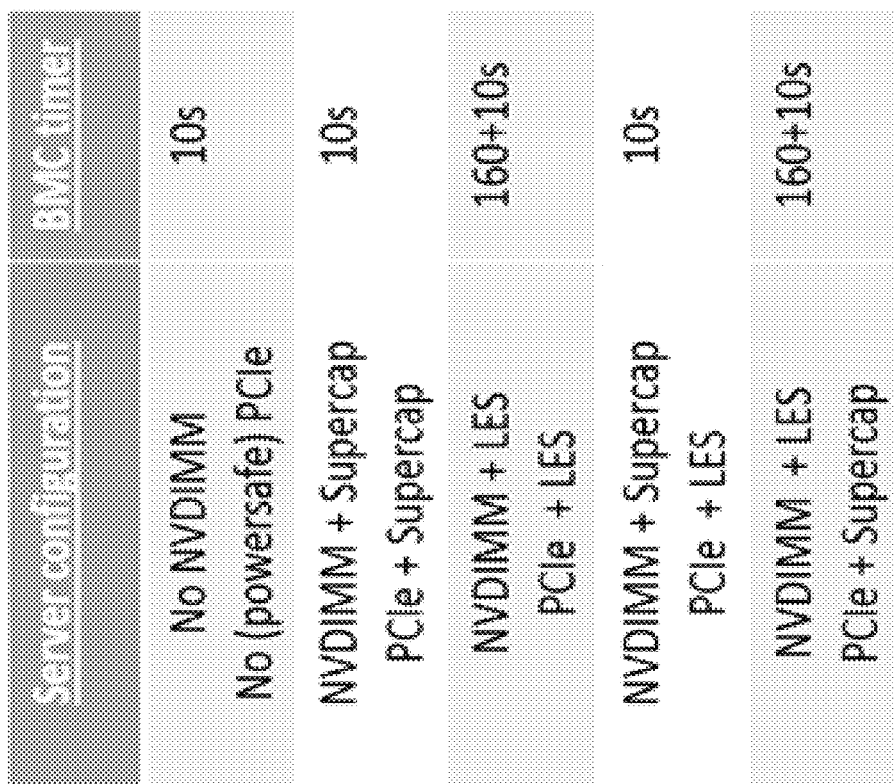
FIG. 11 includes a diagram and table illustrating power-sequencing device state transitions and timing.
Figure 11:
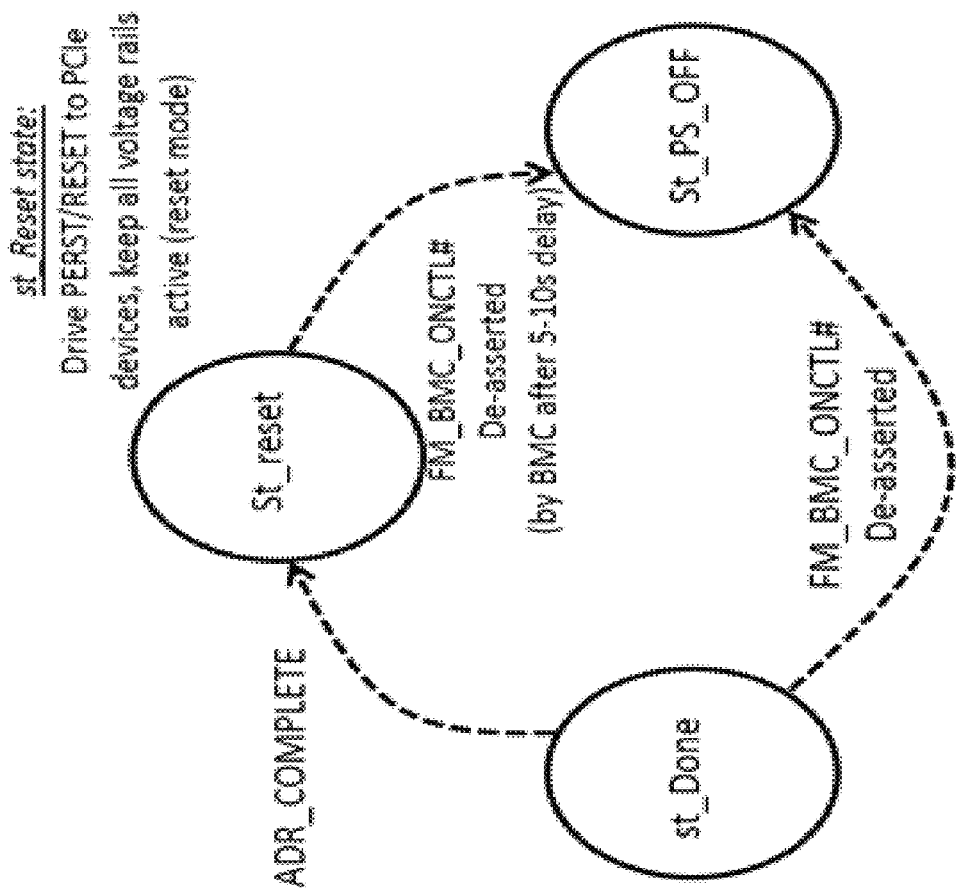

Unlike the supercap based PCIe backup where the entire server motherboard can potentially be powered down, the chassis-battery based PCIe-backup keeps the motherboard power rails active for the entire duration of the backup operation. This involves a change in the power-sequencing CPLD behavior; an example of power-sequencing CPLD state transitions is shown in FIG. 11 and discussed below. In the FIG. 11 example, LES indicates a shared local energy store such as a chassis-level battery 204 or a rack-level battery 204. Also, a server BMC does not know the absence/presence of powersafe PCIe devices 136, so the BMC delays power sequencing for 1-5 s regardless of the server configuration. However, the BMC does know the absence/presence of NVDIMMs and their supercaps via the meminfo data structure.

A CPLD power sequencing operation in the presence of powersafe PCIe devices using three power states is shown in FIG. 4. During normal server operation, the CPLD stays in the st_Done state in which all power is good and everything in the CPLD's scope is out of reset. The CPLD is made aware of an impending PCIe backup using the ADR_COMPLETE signal. During this backup operation, the CPLD keeps powering 344 all voltage rails that are used for the PCIe backup operation. This is achieved by transitioning to the st_RESET power state where the implementation sends PERST/RESET signal to the PCIe devices 136 and keeps their voltage rails active but possibly in a low-power reset mode. In some embodiments, in st_RESET the CPLD ignores all power off signals like S5. The duration for which these voltage rails are held active (occupancy duration in the st_RESET state) depends on factors such as the presence of PCIe, presence on supercap on the PCIe, the DRAM size used in the PCIe devices. This example uses 10 s (ten seconds) as the allowed PCIe device backup time (this duration can also be configured). As shown in the Figures, the BMC is notified of a PCIe backup operation by connecting the ADR_COMPLETE signal to BMC GPIO10. After the notification of the ADR_COMPLETE signal, the BMC will wait for a predetermined amount of time (10 s) before deasserting FM_BMC_ONCTL# pin on the CPLD, which resets the entire motherboard.

A Connection Alternative and Terminology

Some embodiments include connection/connected where others include coupling/coupled. For example, some embodiments provide a volatile memory data save subsystem for a motherboard in a system, the subsystem comprising: a volatile memory device shared power source connection which when connected to a shared power source and also connected to volatile memory device by the motherboard provides operating power to the volatile memory device, the volatile memory device being one of at least two separately pluggable devices that receive power from the shared power source; a data save trigger connection which when connected to the volatile memory device and triggered sends a data save command toward the volatile memory device; and a data save trigger controller which operates to trigger the data save trigger connection when at least one of the following conditions occur: (a) a programmable amount of time passes with the volatile memory device being powered by a source which is not driven by an AC power source; (b) a power level on the volatile memory device shared power source drops to a value which is less than normal operating power but is still sufficient to power the volatile memory device during a data save operation; (c) the data save trigger controller is notified of an operating system shutdown command; or (d) the data save trigger controller is notified of an explicit data save command in the absence of an operating system shutdown command. Similar coupling vs. connection alternatives exist with other embodiments.

"Connected" items on a motherboard touch each other and/or have a direct electrical connection with one another. By contrast, items may be "coupled" electrically and/or behaviorally even though they do not touch or have a direct electrical connection to each other. In addition, "connect" is also used in the art when discussing network connections, causal relationships, and other circumstances in which physical touching or a direct electrical connection is not necessarily present, and should be understood accordingly.

Racks vs. Chassis

Rack mounted servers use self-contained hardware, in the sense that one can plug a rack mounted server into a standard electrical outlet, connect network cables, boot, and have an operational server. They are often mounted in a computer hardware rack, usually 19 inches in width, but they could sit on a table or other surface instead. Blade mounted servers are not self-contained. They are designed to be mounted in a blade enclosure, called a "chassis", which includes power supplies and networking components. The chassis with inserted blades may be rack-mountable. The term "frame" is used herein to mean a rack and/or chassis.

Additional Observations

NVDIMM traditionally uses supercapacitors on the DIMM to backup their DRAM contents to persistent storage when power is lost to the system motherboard. These supercapacitors are typically installed per DIMM and are expensive in terms of fiscal cost and the physical real-estate space within the server chassis, particularly in high density configurations. In addition, the low temperature operating conditions of these supercapacitors makes it difficult to cool high density configurations with NVDIMM.

A familiar process for initiating an NVDIMM backup with supercapacitors goes through the chipset ADR pin. This pin causes a chipset to flush CPU memory buffers and assert the ADR pin on all NVDIMMs. ADR is an active low signal, normally driven low by the loss of power to a system motherboard or comparator on the motherboard that responds to voltage drops as power deteriorates from the motherboard when AC power is lost to the power supplies. Supercapacitors coupled to the NVDIMMs would typically supply power for the DIMM backup operation.

A related mechanism can be used to backup NVDIMMs that have no supercapacitors per DIMM module internal battery module. Instead the NVDIMMs have a centralized battery located off the server motherboard and shared across one or more systems, such as Microsoft® Cloud Server Local Energy Storage (LES)/Cloud Server Chassis Battery (mark of Microsoft Corporation). There are also provisions in some embodiments of the Microsoft Cloud Server for the Chassis Manager module to trigger NVDIMM data save, while the local energy storage provides the capacitance Some embodiments have the Cloud Server LES solution lower 310 output voltage after a pre-determined time on battery, normally configured as the generator transition time. After this time expires and AC power has not returned the power supplies or battery module know the generators have not come online and loss of power is imminent. Before running out of battery capacity the power supply control module or battery management module can lower the voltage of the battery from 12 volts to a point 316 below the blade motherboard comparator for signaling the ADR pin on the PCH.

By lowering the voltage output to a point below the motherboard comparator, NVDIMM backup will be automatically triggered, while the DIMM auxiliary power rail remains powered at 11 volts or a point just below the comparator trigger level. The lower voltage rate 316 is enough to complete the NVDIMM backup to persistent storage. In some embodiments, no distinction is made between auxiliary power and normal power rails during backup. The same triggering 354 mechanism can be used on higher voltage implementations.

In some embodiments, a cloud server NVDIMM and PCIe device solution has persistence data save capacitance without internal batteries or supercapacitors. They use voltage regulation from external power supplies control circuitry to intentionally invoke a blade's motherboard voltage comparator into triggering the ADR pin while the power supply batteries still have enough capacity to perform the NVDIMM backup. NVDIMM methodology and power sequencing used for use in cloud servers is also described herein.

A benefit of this implementation is to remove internal capacitors and batteries while eliminating single points of failure in the system and covering corner cases for data loss during the persistent RAM backup. Some examples discussed are specific to Microsoft Cloud Server, but their teachings and the methods of implementing NVDIMM without discrete DIMM capacitance or battery in a Chassis or Rack configuration are more widely applicable.

In some embodiments, ADR trigger (DIMM backup) events are primarily sourced from 3 entities: PCH, CM, and 12V under voltage.

PCH—OS or another software entity can order ADR through the PCH as part of an ordered shutdown or reboot.

Chassis Manager—The chassis manager can order ADR through the BMC as part of monitoring the chassis 12V power supplies. In the event of an alert issued by the power supplies, the chassis manager is responsible for evaluating criticality of the alert and ordering ADR through the BMC. In this case, the BMC would be responsible for driving a GPIO to the ADR_TRIGGER# pin of the PCH. This is primarily intended for systems with chassis internal battery backup in which a failure can be detected, but there is no immediate loss of local 12V power.

12V Under Voltage—Under voltage monitoring of the output of the 12V hot swap controller can generate ADR_TRIGGER# to the PCH. This can be implemented both for systems with NVDIMM and Supercap and for systems with NVDIMM and no local capacitance. The chassis battery backup can provide energy for the backup while the battery DCU or controller can lower the output voltage to invoke an under voltage condition.

With further attention to FIG. 4, some cloud server ADR Triggering Signals are discussed below.

ADR_TRIGGER#—Sourced from 12V under voltage monitor or directly from BMC. When asserted this signal initiates an ADR within the PCH. The under voltage can be purposely invoked by the PSU/Battery or invoke naturally due to loss of voltage to the motherboard during power loss.

ADR_COMPLETE—Sourced from PCH. When asserted this signal indicates that the ADR operation has completed and that the NVDIMM save operation can begin. If the configuration is NVDIMM+Chassis Battery, the CPLD state machine responds to ADR_COMPLETE by initiating a system reset and initiating reset or save to the datasafe storage devices.

NVDIMM _PRSNT—Driven from the BMC. NVDIMM+ Chassis Battery. Indicates to the CPLD that NVDIMMs are present in the system that contains the chassis internal battery backup. This signal is used to qualify ADR_COMPLETE so that the CPLD state machine doesn't respond to ADR_COMPLETE if the configuration is not NVDIMM+ Chassis Battery. This would ensure that if the configuration is not NVDIMM+Chassis Battery, normal shutdown would occur.

SAVE#—When asserted this signal puts the NVDIMM into the save mode. This signal is triggered by ADR_COMPLETE. It is buffered through the CPLD in order to provide qualification.

FM_BMC_ONCTL#—Power enable signal sourced from the BMC or PCH. It is expected that this is the PWREN input to the CPLD state machine. For NVDIMM+Chassis Battery, the deassertion of this signal would cause the CPLD to disable switched power on the blade.

Some Additional Combinations and Variations

Any of these combinations of code, data structures, logic, components, signals, signal timings, and/or their functional equivalents may also be combined with any of the systems and their variations described above. A process may include any steps described herein in any subset or combination or sequence which is operable. Each variant may occur alone, or in combination with any one or more of the other variants. Each variant may occur with any of the processes and each process may be combined with any one or more of the other processes. Each process or combination of processes, including variants, may be combined with any of the medium combinations and variants describe above.

In some examples, a means for preserving data despite AC power loss includes a data save state machine 214. In some, a means for preserving data despite AC power loss includes a device and/or circuitry consistent with FIG. 2. In some, a means for preserving data despite AC power loss includes a device and/or circuitry whose operation is consistent with FIG. 4. In some, a means for preserving data despite AC power loss includes a device and/or circuitry whose operation is consistent with the state transitions shown in FIG. 11. In some, a means for preserving data despite AC power loss includes a CPLD. In some, a means for preserving data despite AC power loss includes a CPLD coupled to a BMC. In some, a means for preserving data despite AC power loss includes a CPLD, a BMC, and a PCH, coupled together as shown in FIG. 2. In some, a means for preserving data despite AC power loss includes a CPLD, a BMC, and a PCH, coupled together as shown in FIG. 7.

Some embodiments include a motherboard, hot swap controller, baseboard controller, data save state machine, and platform controller hub, consistent with FIG. 2. Some include a motherboard, hot swap controller, baseboard controller, data save state machine, platform controller hub, and frame manager, consistent with FIG. 2. Some include all items shown in FIG. 2 except the generator(s) 216. In some, the frame is a chassis; in some it is a rack. Some embodiments include the items shown in FIG. 7. Some include the items shown in FIG. 8. Some include the items shown in FIG. 9. Some include a device and/or circuitry whose operation is consistent with datasafe operation, e.g., as illustrated in FIG. 10 but not necessarily with the same times.

Some embodiments include steps 302 and 324. Some include steps 302, 324, and 332. Some include steps 302, 328, and 332. Some include steps 310 and 324. Some include steps 310, 324, and 326. Some includes steps 324 and 340. Some include steps 356 and 324. These are merely some of the many possible examples that will be apparent to one of skill in the art.

CONCLUSION

Although particular embodiments are expressly illustrated and described herein as processes, as configured media, or as systems, it will be appreciated that discussion of one type of embodiment also generally extends to other embodiment types. For instance, the descriptions of processes in connection with any of the Figures also help describe configured media, and help describe the technical effects and operation of systems and manufactures like those discussed in connection with other Figures. It does not follow that limitations from one embodiment are necessarily read into another. In particular, processes are not necessarily limited to the data structures and arrangements presented while discussing systems or manufactures such as configured memories.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "process, system, article of manufacture, configured computer readable medium, and/or other example of the teachings herein as applied in a manner consistent with applicable law." Accordingly, a given "embodiment" may include any combination of features disclosed herein, provided the embodiment is consistent with at least one claim.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways in a given implementation without necessarily omitting desired technical effects from the collection of interacting modules viewed as a whole.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims and the abstract, as filed, are part of the specification.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment.

Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A volatile memory data save subsystem for a motherboard in a system, the subsystem comprising:
    a volatile memory device shared power source coupling that when coupled to a shared power source and also coupled to a volatile memory device by the motherboard, provides operating power to the volatile memory device, the volatile memory device being one of at least two separately pluggable devices that receive power from the shared power source;
    a data save trigger coupling that when coupled to the volatile memory device and triggered, sends a data save command toward the volatile memory device; and
    a data save trigger controller that operates to trigger the data save trigger coupling when at least one of the following conditions occur:
        (a) a programmable amount of time passes with the volatile memory device being powered by a source which is not driven by an alternating current ("AC") power source;
        (b) a voltage level on the volatile memory device shared power source drops to a value that is less than normal operating power but is still sufficient to power the volatile memory device during a data save operation;
        (c) the data save trigger controller is notified of an operating system shutdown command; or
        (d) the data save trigger controller is notified of an explicit data save command in the absence of an operating system shutdown command.

2. The volatile memory data save subsystem of claim 1, wherein the volatile memory device includes an non-volatile dual in-line memory module ("NVDIMM"), the volatile memory device shared power source coupling includes an NVDIMM slot, and the shared power source includes at least one of: a chassis battery, a shared rack level battery system, a diesel generator, a natural gas generator, another generator.

3. The volatile memory data save subsystem of claim 1, wherein the volatile memory device includes an NVDIMM that has no dedicated supercapacitor and also has no dedicated battery.

4. The volatile memory data save subsystem of claim 1, wherein the volatile memory device includes a Peripheral Component Interconnect Express ("PCIe") device, and the volatile memory device shared power source coupling includes a PCIe rail on the motherboard.

5. The volatile memory data save subsystem of claim 1, wherein the data save trigger controller operates to trigger the data save trigger coupling when the programmable amount of time passes with the volatile memory device being powered by a chassis battery, and the programmable amount of time was previously programmed based on a chassis battery power estimation.

6. The volatile memory data save subsystem of claim 1, wherein the data save trigger controller operates to trigger the data save trigger coupling when the power level on the volatile memory device shared power source drops below a 12V normal operating power to a level between 10.8V and 11.5V that is sufficient to power the volatile memory device during the data save operation.

7. The volatile memory data save subsystem of claim 1, wherein the data save trigger controller operates to trigger the data save trigger coupling when the data save trigger controller is notified of an explicit data save command in the absence of an operating system shutdown command.

8. A volatile memory data save subsystem for a motherboard in a server system, the subsystem comprising:
    a frame having a power supply and a frame manager;
    a plurality of volatile memory device power source couplings coupled to the frame power supply and to respective volatile memory device groups, each volatile memory device group including at least one volatile memory device;
    a data save trigger coupling that when coupled to at least one of the volatile memory devices and triggered sends a data save command toward at least one of the volatile memory devices; and
    a data save trigger controller that operates to trigger the data save trigger coupling when at least one of the following conditions occur:
        (a) a programmable amount of time passes with the frame power supply not receiving alternative current ("AC") power;
        (b) the frame power supply drops output voltage to a value that is less than a normal operating level but is still sufficient to power the volatile memory device during a data save operation;
        (c) the data save trigger controller is notified of an operating system shutdown command; or
        (d) the data save trigger controller is notified of an explicit data save command in the absence of an operating system shutdown command; and
    wherein each of the volatile memory devices has no dedicated supercapacitor and also has no dedicated battery.

9. The volatile memory data save subsystem of claim 8, wherein at least a portion of the data save trigger controller resides in the frame manager.

10. The volatile memory data save subsystem of claim 8, wherein the volatile memory device power source couplings include at least one of the following: an non-volatile dual in-line memory module ("NVDIMM") slot, a Peripheral Component Interconnect Express ("PCIe") rail.

11. The volatile memory data save subsystem of claim 8, wherein the frame includes a chassis, the power supply is a chassis power supply, and at least one of the volatile memory devices resides on a blade server that is coupled to the chassis.

12. The volatile memory data save subsystem of claim 8, wherein the frame includes a rack, the power supply is a rack power supply, and at least one of the volatile memory devices resides on a rack mounted server that is coupled to the rack.

13. The volatile memory data save subsystem of claim 8, wherein the frame data save trigger coupling is coupled to all of the volatile memory devices on the motherboard and when triggered sends a data save command toward all of the volatile memory devices.

14. A process for saving data despite power loss in a computing system having a main power supply and multiple memory devices couplable to a shared power source, each of the memory devices including a non-volatile dual in-line memory module ("NVDIMM") with a volatile memory portion and a non-volatile memory portion and without a corresponding dedicated power source, wherein the process comprising:
  detecting a data save trigger condition for the memory devices in the computing system,
    the data save trigger condition including one or more of:
      an output voltage of the main power supply is lowered to a value that is less than a normal operating level but is sufficient to power the memory device during a data save operation;
      a notification of an operating system shutdown command is received; or
      an explicit data save command is received;
  in response to detecting the data save trigger condition, sending a data save command to one of the memory devices; and
  providing power to the one of the memory devices from the shared power source, thereby allowing the memory device to perform a data save operation to save data from a volatile memory portion of the memory device into a non-volatile memory portion of the memory device with the power provided from the shared power source.

15. The process of claim 14, wherein sending a data save signal includes dropping a power supply output to a value that is less than a normal operating power but is still sufficient to power the volatile memory device during the data save operation.

16. The process of claim 14, wherein providing power to the memory device from the shared power source includes coordinating a voltage step down.

17. The process of claim 14, further comprising performing an asynchronous dynamic random access memory ("DRAM") reset at the NVDIMM in response to the data save command.

18. The process of claim 14, wherein providing power to the memory device includes maintaining power to a Peripheral Component Interconnect Express ("PCIe") rail and/or a dual in-line memory module ("DIMM") rail, and removing power after the data save operation is complete.

19. The process of claim 14, further comprising lowering the output wattage of the shared power source.

20. The process of claim 14, wherein after commanded data save operations are complete, removing power from the memory device and resetting the computing system.

* * * * *